United States Patent [19]

Anderson

[11] 4,013,840
[45] Mar. 22, 1977

[54] TDM AND FDM TELEPHONE COMMUNICATION

[75] Inventor: Scott K. Anderson, Orem, Utah
[73] Assignee: Teleplex, Inc., Orem, Utah
[22] Filed: July 11, 1975
[21] Appl. No.: 595,100

Related U.S. Application Data

[63] Continuation-in-part of Ser. No. 492,397, July 29, 1974, abandoned, and a continuation-in-part of Ser. No. 253,265, May 15, 1972, abandoned, and a continuation-in-part of Ser. No. 601,363, Aug. 4, 1975.

[52] U.S. Cl. .................. 179/15 FD; 179/2.5 R; 179/15 AL; 179/15 AT
[51] Int. Cl.² .......................................... H04J 1/10
[58] Field of Search ........ 179/15 FD, 2.5 R, 15 FS, 179/15 AT, 15 AL

[56] References Cited
UNITED STATES PATENTS

| | | | |
|---|---|---|---|
| 3,573,379 | 4/1971 | Schmitz | 179/15 BY |
| 3,809,815 | 5/1974 | Reed | 179/2.5 R |
| 3,864,521 | 2/1975 | De Long | 179/2.5 R |

*Primary Examiner*—David L. Stewart
*Attorney, Agent, or Firm*—Trask & Britt

[57] ABSTRACT

A plurality of communicating stations have transmitters, receivers and control means. The transmitters are tunable across a broad radio frequency spectrum and transmit an amplitude modulated selected carrier frequency. Each receiver is set to receive only one preselected amplitude modulated carrier frequency fixed and identified with each particular station. Stations may be regarded as telephones having signaling means and a chassis. The control means includes means to receive TDM control signals from and to supply TDM control signals to a remote common equipment unit. The control signals and amplitude modulated carriers are sent and received over common cabling. The common equipment unit includes processor means to process and generate control signals and means to interface with an external telephone system.

18 Claims, 14 Drawing Figures

TDM AND FDM TELEPHONE COMMUNICATION

RELATED APPLIATIONS

This application is a continuation-in-part of the following U.S. patent applications for a "Random Access Multiple Station Communication System": Ser. No. 253,265, filed May 15, 1972, which is now abandoned; Ser. No. 492,397, filed July 29, 1974, which is now abandoned; and Ser. No. 601,363, filed Aug. 4, 1975, which is copending. The disclosures of all these applications are hereby incorporated by reference as if fully set forth herein.

BACKGROUND OF THE INVENTION

Field

This invention relates to communication systems, particularly telephone systems. More particularly this invention provides a random access multiple station communication system employing time division multiplexing control means and frequency division multiplexing means for communicating information.

State of the Art

Both frequency and time division schemes have been applied to communication systems. For example, U.S. Pat. No. 3,573,379 (Schmitz) discloses a communication system having both frequency and time division schemes. According to Schmitz, system control is effected by a binary bit stream which is examined by a subscriber to ascertain the existence of an available channel and to allow the subscriber to occupy the first vacant channel in sequence within a priority system usually based on ascending integers assigned to denote the available channels. The bit stream advises a called subscriber that he is being called while indententifying the channel and other control data necessary to establish communications.

U.S. Pat. No. 3,261,922 (Edson) is similar to Schmitz. Edson employs several frequency channels. Subscribers seek access to, and if available, occupy one of several frequency divided channels. A time division supervisory channel conveys appropriate control data to a receiving trunking circuit so that the communicated information can be extracted from the channel and directed to the intended subscriber.

U.S. Pat. No. 2,584,259 (Crane) employs a limited frequency multiplexing scheme in which a telephone station transmits at various frequencies and receives on but one frequency identified with the station. However, control of the scheme is effected by phase shifting signals which is limited in capability, reliability and range.

In general, Schmitz, Edson and Crane may be regarded as efforts to provide an improved telephone communication system which (1) allows for random access by a plurality of subscribers, (2) is automatic in operation, (3) has good audio characteristics, (4) is available to a subscriber upon user demand, (5) selectively incorporates numerous auxiliary use features, and (6) eliminates expensive wiring and extensive centralized equipment (e.g., PABX).

Systems to date have been unsatisfactory compromises that have failed to meet all the desired characteristics. Radio frequency signaling with frequency division techniques has been adopted to reduce centralized switching equipment and save wiring costs. However, the range of frequencies available is limited because transmitters capable of transmitting over a wide range (e.g., 1 kilocycle to 100 mega cycles) of frequencies are very expensive and less than optimum in functional reliability and the like. Accordingly, systems have heretofore been restricted to a fairly narrow range of frequencies. For example, Edson is restricted to a range of frequencies from about 315 cycles to about 5.3 kilocycles.

When the range of frequencies is limited, the total number of channels or bands is similarly limited. That is, a band carrying information must have a specified width to satisfy the need for good audio characteristics such as fidelity. For example, Edson transmits non-voice audio in a band or channel 200 cycles wide which is too narrow for good audio fidelity. Also, there must be a gap of unused frequencies between channels to preclude feedback, cross talk and related types of interchannel interference. In view of the need for a band width and a gap, the total number of channels (bands) available is limited. Edson, for example, has 7 channels.

In view of the fact that the total number of channels available is small (e.g., 5, 10 or even 30) all subscribers do not have access to the system upon demand. That is, time sharing is imposed on the subscribers. All bands can be occupied at any given time so that a particular subscriber will have to wait until a channel becomes available.

In order to control frequency division communications systems of the type above described, time division multiplex control schemes have been employed. Tone codes have also been used as set forth in the parent application hereto, Ser. No. 253,265, filed May 15, 1972.

Time division multiplex (TDM) schemes typically send a signal requiring synchronization at each telephone (subscriber) station. The signal is a pulse train or train of amplitude modulated codes multiplexed with voice amplitude modulated signals. The codes provide dialing, ringing and related control signals. In particular, they control the assignment of unoccupied channels to requesting subscribers. (E.g., see Edson). The status of each channel in the system is set forth in each pulse train; and much of the useable information-carrying ability of a particular pulse train is consumed. The capability and size of the control system thus becomes critical in providing the various auxiliary user functions desired (e.g., conference, hold, etc.). A larger control system suggests more elaborate and expensive equipment without changing the basic data limitations significantly. As a result, the cost increases along with the potential for unreliability.

In resorting to frequency multiplexing schemes, those skilled in the art will recognize that a critical element of such a scheme is the transmitter/receiver units. The most economical transmitter unit would be one set to transmit on a single band. However, frequency multiplexing by its nature requires the use of transmitters capable of transmitting on numerous bands. As hereinabove discussed, the cost of transmitters capable of transmitting over a wide range of frequencies (band/channels) is prohibitive. Indeed, the cost of a transmitter capable of transmitting on just a few band/channels is also high, though not quite as high as a wide range transmitter. The increased cost may be attributed to the extra components and circuits needed to provide a multiband transmission capability. For example, phase locking of transmitter carriers with a reference frequency are typically expensive and cumbersome prohibiting the use of economical wide range transmitters.

To avoid use of numerous expensive multiband transmitters, present FDM systems typically reflect a compromise wherein (1) the number of channels to be used is reduced as hereinbefore discussed, and (2) centralized equipment which is cheaper in comparison, is employed with time sharing and limited access. The Edson system is an example of both these situations.

Schmitz is one example of efforts to avoid the restrictions and disadvantages arising from use of very limited transmitters. In particular, Schmitz employs a fairly narrow spectrum variable transmitter (277 KHZ to 668 KHZ) along with sideband techniques to obtain about 127 useful channels. However, resort to sideband schemes adversely affects audio qualities while significantly increasing costs. Subscriber access is improved but not unlimited; and control sophistication and complexity is simultaneously and undesirably increased. Maintenance costs are concomitantly prohibitive.

Additional transmitter circuitry necessary to employ multiband transmitters is typically quite complex which is in turn both costly and inevitably unreliable. For example, Schmitz employs, inter alia, single sideband circuits and a phase detection scheme which has heretofor been less than effective while being particularly costly. Crane suggests the use of expensive oscilliscopes at each station to detect control signals to operate its transmitters.

Summary of the Invention

A random access multiple station telephone system is disclosed which includes a plurality of stations and a processor interconnected by common cabling. The stations have transmitter means to transmit amplitude modulated carriers across a broad radio frequency spectum. The stations also include receiver means to receive amplitude modulated carriers transmitted by other stations. Each receiver is preset to receive only one carrier frequency which is identified with said receiver and which is different from the preassigned center frequencies of all other receivers. The stations also include logic and audio control means to send and receive control signals and control the station. The processor includes a memory means, input-output means, programming means, and interface means to transmit and receive control signals from the various statons in the system.

The control signals are time division multiplexed (TDM) signals carrying pulse groups for identifying a calling station to a called station and for transmitting other control information to the called station and the calling station. The telephone data (e.g., audio) is transmitted in a frequency division multiplex (FDM) scheme using the carriers which are amplitude modulated (AM) by the audio and spaced apart in frequency bands. The TDM control signals are transmitted on a control data coax; and the FDM signals are transmitted on another coax.

The transmitter includes a carrier generator and modulator. The carrier generator includes means to set the output carrier over a wide range of carriers. The carrier generator preferably includes means to phase lock the output of the generator with a reference signal.

The logic and audio control means preferably includes means for digitally turning the carrier generator and controlling regular desired telephone station functions (e.g., dial tone, busy signal, dialing signals).

The central equipment unit, in another embodiment includes interface means to interface with an external telephone system such as the Bell Telephone System. In yet another embodiment, an operator's console is provided to intercept and distribute incoming telephone calls from the external telephone system or from internal telephone units as desired.

In yet another embodiment, conference call capabilities are included. Separate conductors are interconnected between the stations to carry a plurality of conference calls transmitted thereon in a time-division multiplex scheme. Means in each station are included to impart and extract the time division multiplexed information as directed by the logic and audio control means.

In yet another embodiment, means may be included to provide for incoming call camp-on, means to notify the station on which the call is camped-on of the existence of a camped-on call, transfer means to transfer calls between stations, abbreviated dial means and call diversion means. Other embodiments paging and public address means may be included. Further embodiments may include various classes of night service and music interlude during hold and camp-on situations.

BRIEF DESCRIPTION OF THE DRAWINGS

In the drawings, which illustrate what is presently regarded as the best mode for carrying out the invention.

DESCRIPTION OF THE ILLUSTRATED EMBODIMENT

Figure 1:
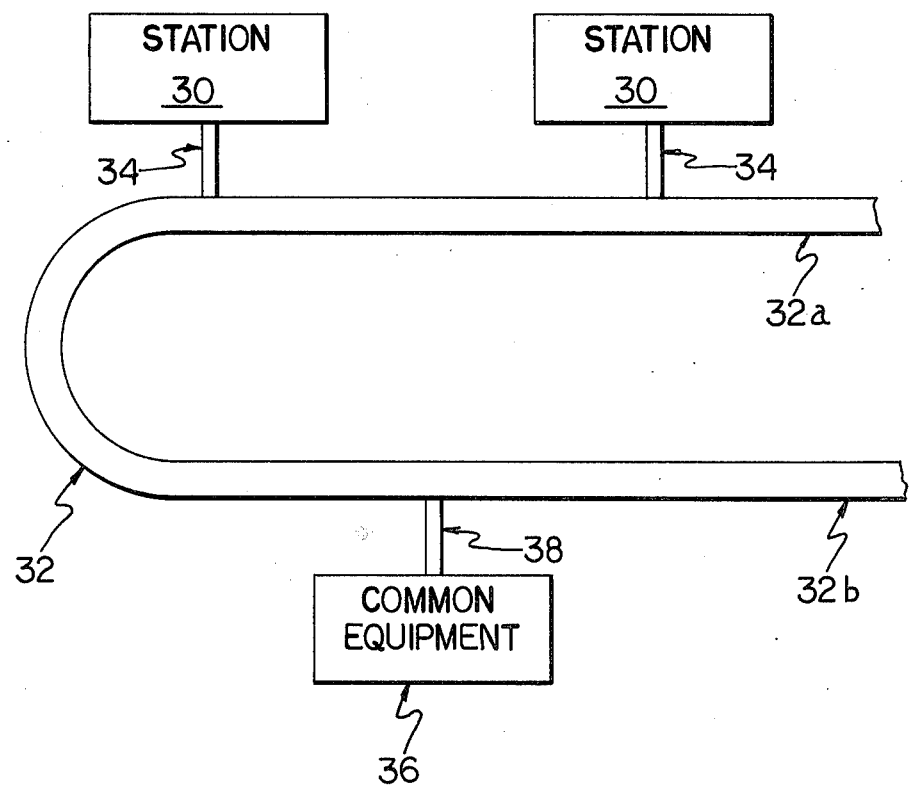
FIG. 1 is a simplified block diagram illustrating a preferred unit arrangement of the invention.

FIG. 1 is a simplified block diagram depicting the relationship of several components of the invention. As shown, the communication system of the instant invention includes a plurality of stations 30 connected to an interconnecting cable 32 by tap lines 34. A common equipment unit 36 is also connected to the cable 32 by a tap line 38. The legs 32a, 32b of the cable 32 may be extended to connect additional stations 30 as required for a particular installation.

Figure 2:
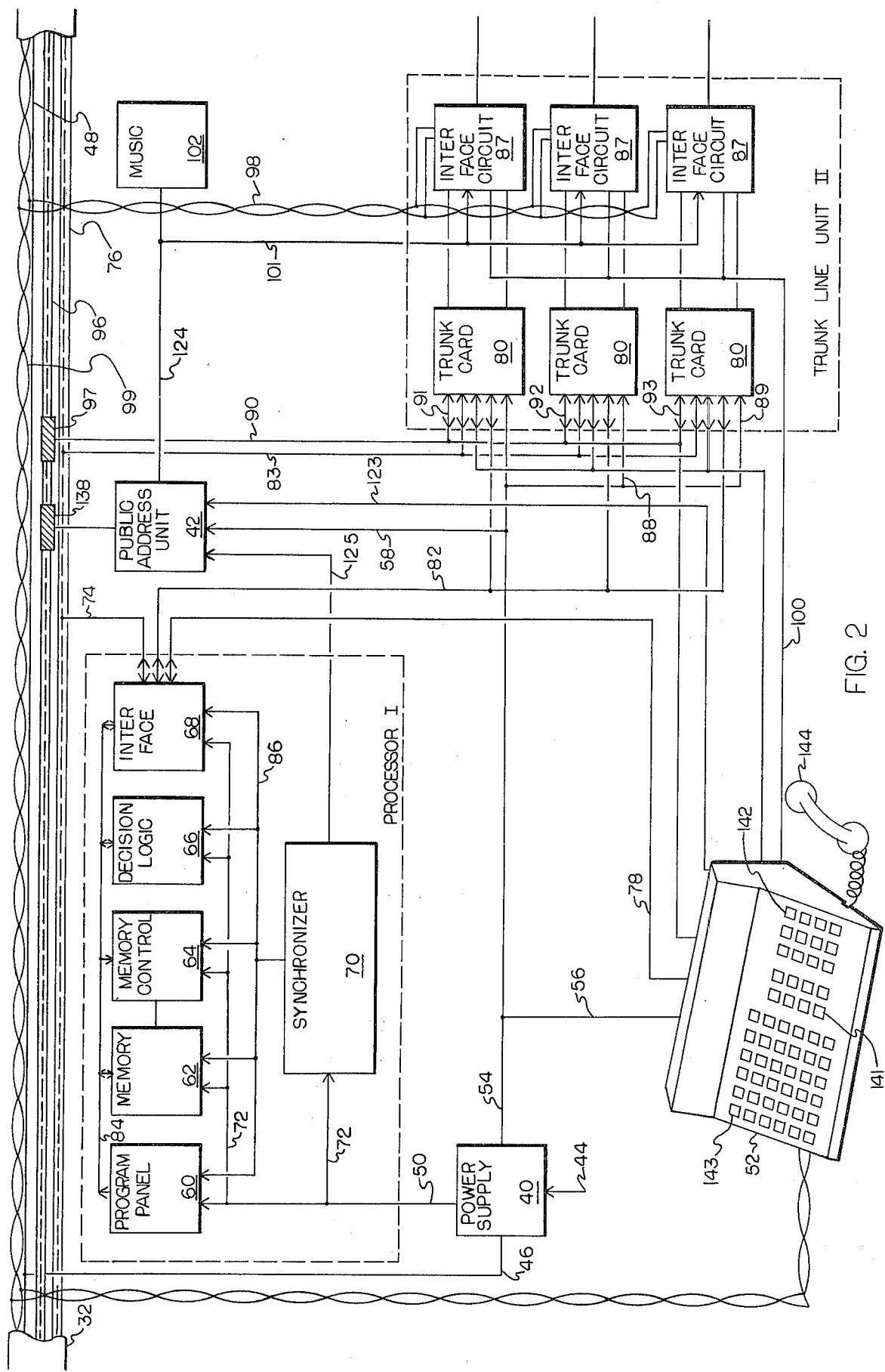
FIG. 2 is a block diagram of components conveniently located within a central equipment unit with an operator's console connected thereto.
Figure 5:
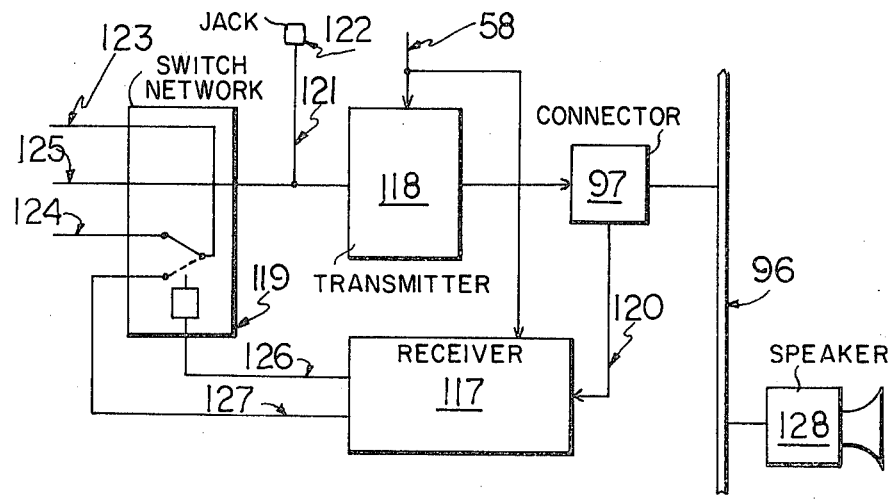
FIG. 5 is a simplified diagram of optional public address/page components positionable within the common equipment unit of FIG. 2.

The common equipment unit 36, which is illustrated in greater detail by FIG. 2, includes a Processor I, Trunk Line Unit II, and power supply 40. The common equipment unit 36 may also contain other components necessary or desirable for system operation. For example, public address system 42 components may be conveniently located in equipment unit 36. FIG. 5 illustrates one form of public address system interfacing.

The power supply 40 receives electrical power (e.g., 115 volt 50 Hz) from an external source via conductor 44. The power supply 40 may be any of numerous devices known in the art to develop requisite or desired voltages (e.g., 24 volt and 13 volt) for operating the communication system of the instant invention. Power to components not within the common equipment unit 36 is supplied to the cable 32 via conductor 46. As more fully discussed hereinafter, the cable 32 is comprised of several conductors one of which is power conductor 48. The supply conductor 46 is connected thereto. Components of the system in need of electrical power may be connected to cable 32 and conductor 48 to receive such power. It should be noted that for the system illustrated, it is preferred to locate a single power supply 40 in the common equipment cabinet. For other embodiments it may be desirable to have several power supplies dispersed throughout the system to take into account power demand, line losses or physical environment.

The power supply 40 as illustrated, also supplies power to the Processor I via conductor 50 and to the operator's console 52 via conductors 54 and 56. Power is also supplied to the Trunk Line Unit II and to the public address circuitry 42 via conductors 54 and 58 respectively.

The Processor I, which may be regarded as the system control means, includes a program panel 60, a memory 62, a memory control device 64, a decision logic unit 66, an interface circuit 68 and a synchronizer 70. Power to the Processor I is received from power supply 40 via conductor 50 and distributed to the components within the Processor I via distribution conductors 72.

The Processor I automatically sends, receives, stores and processes control information to operate the system. The control information to and from stations 30 are transmitted via conductor 74 which is connected to control data conductor 76 positioned within the cable 32. Control information to and from the operator's console 52 is transmitted via conductor 78. Control information to and from the Trunk Line Unit II and trunk line cards 80 is transmitted via conductor 82, as well as via conductor 83 as more fully discussed hereinafter.

The interface unit 68 operates to translate Processor I information into control signals and transmit said signals to system components as hereinafter discussed. Similarly, it receives signals from system components and translates them into internal Processor I signals, transmitting them to Processor I units via conductors 84.

The decision logic unit 66 in cooperation with the program panel 60 operates to receive, generate and send system control signals through the interface unit 68 as more fully discussed hereinafter. The memory control 64 and memory 62 cooperatively operate to receive, store and process system status information as hereinafter set forth. The synchronizer 70 sends synchronization signals to the units within the Processor I via conductors 86. The interface unit 68 sends the synchronization signal throughout the system.

The Trunk Line Unit II, which constitutes external telephone system interfacing means, includes a plurality of trunk line cards 80 with a matching plurality of interface circuits 87. The trunk line cards 80 are in effect the equivalent of system stations 30 (FIG. 1). The trunk line cards 80 receive electrical power from the power supply 40 via conductors 54, 88 and 89. System control signals are received from the Processor I via conductors 82 and 83. Amplitude modulated signals are sent and received via conductors 90, 91, 92 and 93. Conductor 90 is connected to data coax 96 within cable 32 by connection means 97 as more fully discussed hereinafter. A twisted pair of conductors 98 are connected to the interface circuits 87 and to the twisted pair of conductors 99 located within cable 32 to provide conference call capabilities. The operator's console 52 is also connected to the interface circuits 87 by conductors 100. "Hold" interlude music may also be connected to the interface circuits 87 by conductors 101 from music source 102.

Figure 6:
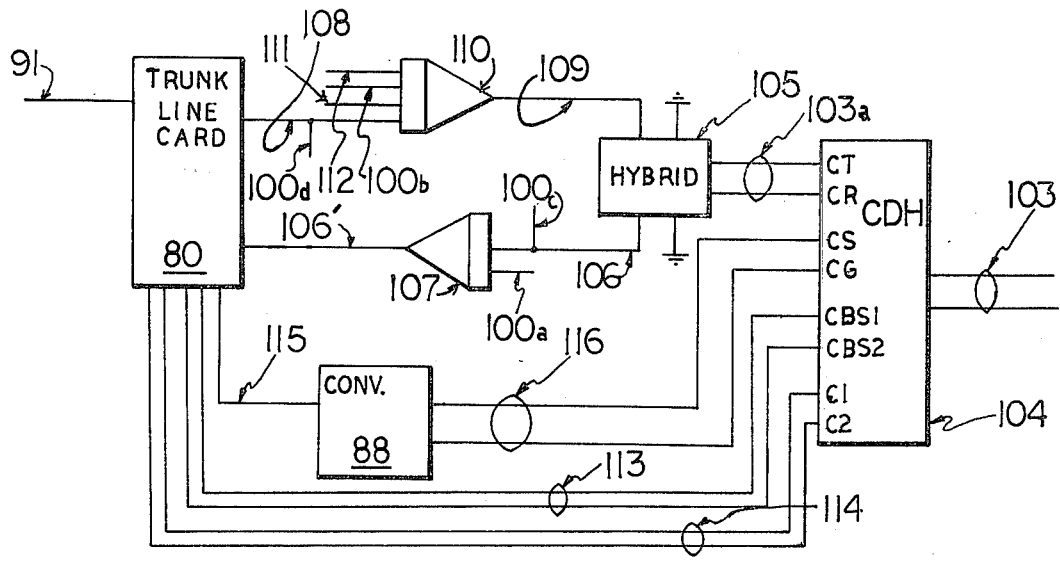
FIG. 6 is a simplified diagram of interface circuitry to interface between the trunk line cards of FIG. 2 and an external phone system.

FIG. 6 illustrates the interface circuitry 87 in greater detail. Conductors 103 connect the "Bell" system central office to a conventional CDH circuit 104. Both incoming and outgoing audio signals are transmitted over conductors 103 and conductors 103a through a hybrid network 105. The hybrid separates the audio signals so that only the incoming signal is supplied to the trunk line card 80. The signal is supplied via conductor 106, 106' and summing amplifier 107. Audio from the operator's console is supplied to the amplifier 107 by conductor 100a.

Outgoing audio is supplied to the hybrid 105 via conductors 108, 109 and summing amplifier 110. Conference audio is separately supplied to the amplifier 110 via conductor 111. Audio input from the operator's console 52 is also supplied to the amplifier 110 via conductor 100b. Music from music source 102 may optionally be supplied to the amplifier 110 via conductor 112 to provide music to the incoming caller while on "hold" or "camp-on" as more fully discussed hereinafter.

Incoming call dialing information is received via conductors 113 when provided for in the "Bell"[system; and incoming ring signals are received via conductors 114 in combination with a ring enable relay (not shown) in the CDH circuit 104 associated with conductors 114. Outgoing dial information is received by the converter 88 from the trunk line card 80 via conductor 115. The converter receives and translates dial signals acceptable to the "Bell" system via conductors 116.

When incoming call is first detected the trunk line card 80 exchanges control signals with the Processor I which may in turn cause the operator's console to indicate the presence of the incoming call (e.g., ring and/or flash a light). The operator may then intercept the call by establishing audio contact via conductors 100b (operator talk) and 100c (operator listen). The operator may also establish contact with the station 30 desired by the incoming caller via conductors 100a (operator talk) and 100d (operator listen). The operator may thereafter put the call through the connection via conductors 106, 106', 108 and 109.

The music source, as shown, is connected to the interface circuit 87 by conductor 101. It may also supply music to the public address sytem 42. The music source 102 may be a tape deck or radio located internal or external to the common equipment unit 36. The music source may be powered by connection to power supply 40 or to power conductor 48 as convenient to the user.

The public address system 42 is optional. As illustrated in FIG. 5, it includes a receiver 117, a transmitter 118 and a switch network 119. The system 42 receives power from power supply 40 via conductors 54 and 58. The receiver 117 which may be a simple fixed channel receiver, receives amplitude modulated carrier signals from the data coax cable 96 via connector means 97 and conductor 120. Any station may access to the receiver 117 by dialing a code turning its transmitter to the frequency of the receiver 117. The demodulated signal is passed through switch network 119 to a fixed frequency transmitter 118. Alternately, the demodulated signal may be supplied to an external public address system via conductor 121 and jack 122.

The switch network may also receive inputs directly from the operator's console 52 via conductor 123, from the music source 102 via conductor 124 and from the synchronizer 70 via conductor 125. The synchronizer 70 input is a night service "gong" tone generated in the synchronizer 70 and supplied when the operator's console 52 is placed in a night service mode of operation. In such mode, the gong sound is generated over the public address unit 42 whenever an incoming call is received from the Bell system.

As shown in FIG. 5, the switch network 119 passes the audio signals to the transmitter 118 or jack 122. An automatic gain control loop 126 controls the connection with the music input 124 so that the music is disconnected and the demodulated output 127 of the receiver 117 is connected whenever the demodulated output increases to a threshold indicating the presence of an audio signal. The transmitter 118 supplies a modulated carrier via the connector means 97 and coax 96 to one or more speaker units 128. The speaker units 128 are fixed channel (super heterodyne) receivers with an amplifier and speaker located as desired by the user.

The operator's console 52, as shown, is in effect a station 30 (FIG. 1) having additional features to permit its user to act as a typical switchboard operator. The console 52 has dialing controls 142 and other controls 141 and 143 which in combination with a conventional handset 144 permit operation as above stated and as more fully set forth hereinafter.

Figure 3:
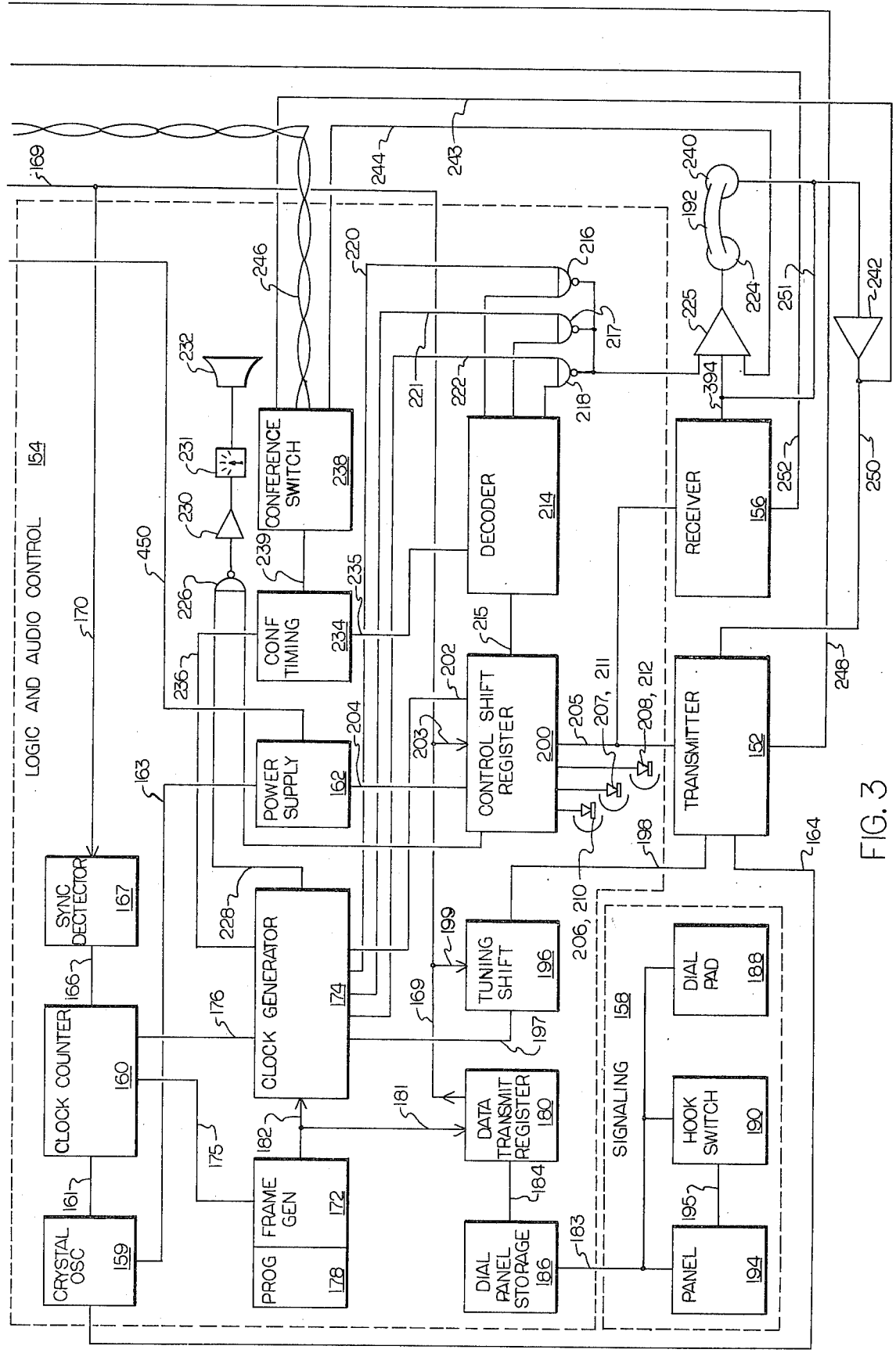
FIG. 3 is a block diagram of a typical station of the invention.

Referring now to FIG. 3, a typical station 30 (FIG. 1) of the invention is illustrated. The station 30 is connected by connector means to cable 32. The station 30 includes a transmitter 152, logic and audio control means 154, a receiver 156 and signaling means 158.

The logic and audio control circuit 154 is a synchronized circuit which controls all the logic and audio functions of the station 30. A reference crystal oscillator 159 (e.g., 4.194304 MHZ) supplies a reference signal to a group of clock counters 160 via conductor 161. The crystal oscillator also receives input power from power supply 162 via conductor 163 and supplies another reference signal to the transmitter 152 over conductor 164. The clock counters 160 receive a reset signal via conductor 166 from the synchronizing detector 167. The detector in turn receives a synchronizing control signal as a pulse group from the system synchronizer 70 (FIG. 2) via the control coax conductor 76 through connector means and conductors 169 and 170. The clock counters 160 supply a synchronized control signal to the frame generator 172 and clock generator 174 via conductors 175 and 176, respectively.

The frame generator 172 has a programming section 178. An interconnected matrix which may be manually drilled to set a digital code is preferred. However, those skilled in the art will recognize alternate methods to set a digital code. The code set identifies to the frame generator that data frame transmitted by the Processor I which is to be identified with the station 30 as more fully discussed hereinafter. The frame generator 172 supplies the identity of the data frame to the data transmiter 180 via conductor 181 and to the clock generator 174 via conductor 182. The data transmitter 180 receives station data signals from the signaling means 158 via conductors 183 and 184 via the dial panel and storage circuit 186 and transmits them to the Processor I during that data frame identified with the station 30 via control coax 169. The signaling means 158 as illustrated includes a dialing device 188 which is preferably a conventional keyboard, a hook switch 190 which is activated when a conventional telephone hand set 192 is removed from its cradle position on the station chassis (not shown), and a push button panel 194 containing control buttons which for this embodiment are (1) hold; (2) transfer-call diversion (TCD); (3) reset; and (4) conference. The dial panel and storage circuit 186 receives the signaling means 158 output. The circuit 186 converts the signaling means output into digital signals, stores the signals and supplies them to the data transmitter 180 upon occurrence of the proper data frame identified with the station 30. The hook switch 190 has contacts associated which are connected by conductor 195 to the reset button on the panel 194. Activation of the hook switch 190 by lifting handset 192 causes the reset button to illuminate. With the handset lifted, the reset button with its associated circuity may be depressed to effect deactivation and reactivation of the hook switch 190. That is, the user need not "hang up" the phone to effect a disconnection. Operation of the reset button effects the disconnection and results in a dial tone by way of codes to the Processor I.

The clock generator 174 supplies a timed signal to the tuning shift register 196 via conductor 197 allowing the register 196 to extract a tuning data signal from the data frame identified with the station 30 via conductor 199. The tuning data signal is supplied to the transmitter 152 to tune the transmitter 152 to a desired carrier frequency as more fully discussed hereinafter.

The clock generator 174 also supplies a timed signal to the control shift register 200 via conductor 202. The timed signal activates the control shift register 200 to receive control data via conductor 203 from the data frame identified with the station 30. The shift register 200 receives power from power supply 162 via conductor 204 and supplies it to the transmitter 152 and receiver 156 via conductor 205 when necessary. For example, the power is "on" to the transmitter 152 and receiver 156 when normal station to station telephone communications exist. They are "off" when in conference mode or when the station is in an awaiting-incoming-call status, etc.

It should be noted that the power supply 162 also supplies power to the other components illustrated which is not shown to avoid confusion in FIG. 3.

The control shift register 200 also supplies activation signals to three light emitting diodes 206, 207, 208 which in turn illuminate lamps 210, 211, 212 respectively, associated with the hold, conference and TCD buttons on the panel 194. Illumination of the lamps 210, 211, 212 is effected upon activation of their associated buttons by way of codes through the Processor I. The register 200 further supplies signals to the decoder 214 via conductor 215. In turn, the decoder 214 supplies enable signals to gates 216, 217, 218. The gates 216, 217, 218 receive 128 HZ, 256 HZ and 1024 HZ tones from the crystal oscillator 159 via clock generator 174 and conductors 220, 221 and 222, respectively. The tones are gated to the earpiece (speaker) 224 of handset 192 through audio amplifier 225 to indicate a dial tone (128 HZ), a busy signal (256 HZ) and the existence of a camped-on incoming call (intermittent 1024 HZ "beep").

The control shift register 200 also supplies an activate signal to the ringer gate 226. The ringer gate 226 receives a pulsed 32 HZ and 512 HZ tone from the clock generator 174 via conductor 228. Upon gating, the tone is passed through amplifier 230 and optional volume control 231 to a speaker 232.

The decoder 214 also supplies a conference circuit identity signal to the conference timing circuit 234 via conductor 235. The timing circuit 234 also receives a timing signal from the clock generator 174 via conductor 236. The timing circuit 234 controls the operations of the conference switch control 238 via conductor 239. The microphone 240 output of handset 192 is supplied through an amplifier 242 to the switch control 238 via conductor 243. An audio input is supplied to the handset earpiece 224 through amplifier 225 via conductor 244. A twisted pair of conductors 246 are connected to the cable 32 twisted pair 99 and to the conference switch 238.

When the conference button on the panel 194 is depressed, the data transmitter 180 sends a signal to the Processor I indicating the selection of conference. The Processor I returns a signal through the control shift register 200 and decoder 214 to the timing circuit indicating which, if any, of four time division multiplexed conference channels is assigned. The timing circuit 234 operates the conference switch 238 in accordance with a time division multiplex scheme (e.g., 15 microsecond samples) to impart and extract voice signals on and from the twisted pair 246.

The transmitter 152 transmits an amplitude modulated (AM) carrier via conductor 248 to the connection means for further transmission to a selected station 30 on coax 96. The transmitter receives voice signals from the handset 192 via conductor 250. It should be noted that a bypass conductor 251 may be included to supply the audio sidetone to the handset 192 earpiece 224 as is typical in many telephone sets.

The receiver 156 is preferably a fixed frequency crystal controlled receiver which receives only the AM carrier signal preassigned to and identified with the station 30 of the receiver 156. Each other receiver in their respective stations 30 are also fixed frequency receivers each being set to receive only its preassigned AM carrier which is different from all others and unique to each station 30. The receiver 156 receives its AM carrier over receive coax 252 from the connector means.

Figure 4:
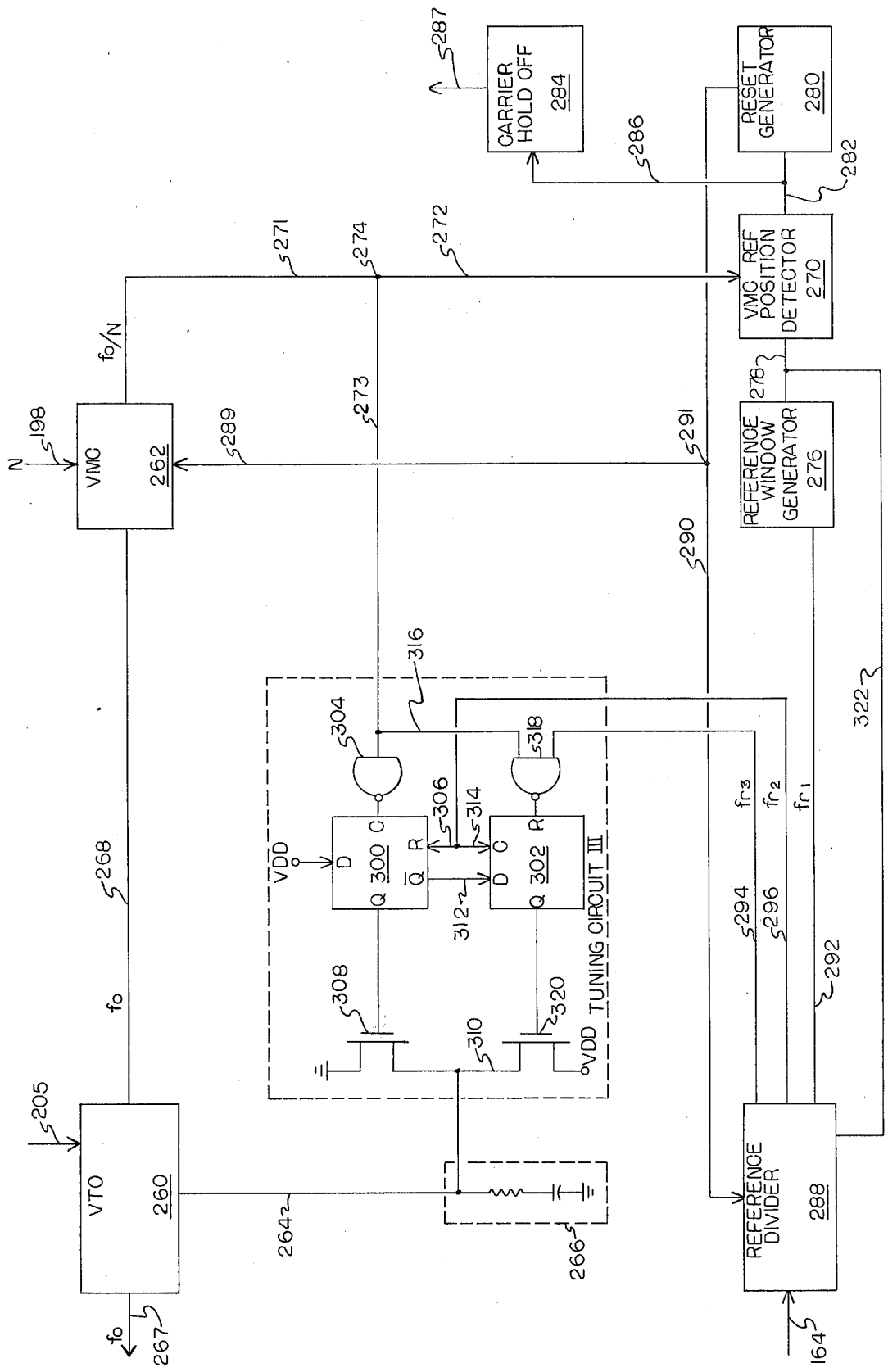
FIG. 4 is a simplified block diagram of a carrier generator within the transmitter of FIG. 3.

Referring now to FIG. 4, a schematic of the carrier generator circuit is shown. The carrier generator is included in the transmitter 152 (FIG. 3). The carrier generator includes a voltage tuned oscillator (VTO) 260, a variable modulus counter (VMC) 262. The VTO 260 receives a tuning signal via conductor 264 and filter 266 from the Tuning Circuit III. The VTO 260 also receives an enable signal turning it on from the shift register 200 via conductor 205. The VTO 260 supplies its carrier output ($fo$) to the modulator circuit hereinafter discussed via conductor 267, and to the VMC 262 via conductor 268. The VMC receives an input from the tuning shift register 196 via conductor 198. The input may be regarded as an integer number ($n$) identified with the carrier ($fo$) necessary to establish communications with a desired receiver in the communication system. The VMC 262 divides the carrier ($fo$) by the integer N and supplies the quotient to the tuning circuit III and the VMC and reference signal position detector 270 via conductors 271, 272, 273 and node 274 as illustrated. The position detector 270 receives reference window signal pulses from the reference window generator 276 via conductor 278. The detector 270 compares the VMC output pulses with the reference window pulses to determine whether or not the VMC pulses occur within the reference window pulses. If the VMC pulse does not occur within the window pulse, the detector 270 sends an output signal to the reset generator 280 via condutor 282 and to the carrier hold-off circuit 284 via conductor 286. Upon receipt, the hold-off circuit 284 interrupts the carrier output (not shown) via conductor 287 so that non-phase locked carrier will not be transmitted. System noise and cross-talk are thereby reduced.

The reset generator 280, upon receipt of the output signal of the detector 270, generates a reset signal and supplies it to the VMC 262 and reference divider 288 via conductors 289, 290 and node 291. The reference divider 288 also receives an input signal from the crystal oscillator 159 via conductor 164 (FIG. 3). The reference divider divides the input signal and supplies a first reference frequency signal (16 KHZ) to the window generator 276 over conductor 292. The reference divider also supplies a second reference signal and a third reference signal to the tuning circuit I via conductors 294, 296.

The tuning circuit I as here illustrated, includes a first flip flop 300 and a second flip flop 302. Both flip flops 300, 302 are edge triggered D-type units. The first flip flop 300 receives VMC output pulses via conductor 273 and gate 304. It also receives control voltage ($Vcc$) from the power supply 162 (FIG. 3) and a reference signal via conductors 296 and 306. The first flip flop output is connected to the transistor (a MOSFET) 308. The transistor 308 supplies a direct current voltage tuning signal (tune-up) to the VTO through node 310 and filter 266. The first flip flop 300 also supplies an enable signal to the second flip flop 302 via conductor 312.

The second flip flop 302 receives a reference signal from the reference divider 288 via conductors 296 and 314. VMC output pulses are received via conductors 273 and 316 via gate 318. Reference pulses from the reference divider are also received via conductor 294 and gate 318. The output of the second flip flop 302 is supplied to transistor 320 which in turn supplies a tune down signal to the VTO via node 310.

In operation, the carrier generator circuit of FIG. 4 provides for carrier frequency tuning as well as phase and frequency locking. Carrier frequency tuning is effected by setting an integer N into the VMC 262. Assuming the VTO 260 is generating an output $fo$, the tuning circuitry described divides the $fo$ by the integer N and compares it with $fr$, the reference frequency. If the quotient $fo/n$ is different from $fr$, the circuitry will cause the VTO 260 to be tuned up or down as necessary until $fo$ reaches a value so that the quotient $fo/n$ will be equal to $fr$. In this way the VTO output $fo$ is the product of $fr$ times N which is the carrier frequency of the receiver 156 of a desired station 30. That is, the integer N is selected and sent to the VMC 262 by the logic and audio control 154 to produce the desired $fo$ (carrier) associated with a called station 30.

Figure 7:
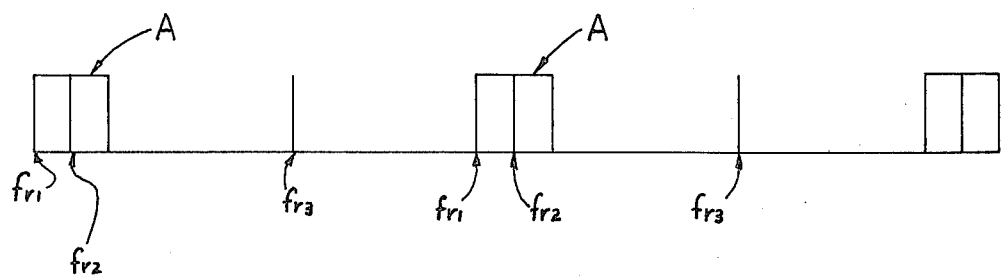
FIG. 7 is a pulse chart illustrating the generation of window pulses for frequency locking.

Frequency locking is effected by comparing VMC output pulses with reference window pulses. The reference window generator 276 generates short pulses at the frequency rate of the output $fr$ of the reference divider 288. As shown in FIG. 7, the short pulses A (about 4 microseconds duration) are square wave pulses. If the detector 270 does not detect or see the existence of a VMC pulse during the period of the short window pulse, it causes the reset generator 280 to send reset signals at the end of the window pulse A. Hence the pulses of FIG. 7 are regarded as window pulses. The reset signal causes the reference generator 288 and VMC 262 to start their next cycles simultaneously or nearly so. Actually, the VMC 262 is started about 2 microseconds after the reference generator 288 so that in the event tuning is accurate, the next VMC pulse should be seen about in the middle of the window pulse A.

The tuning circuit I practically tunes the VTO 260 to effect both frequency and phase lock between $fo$ and $fr$. The tuning is effected by comparing in time a second reference signal $fr_2$, a third reference signal $fr_3$ and the VMC output pulse. It should be noted that reference pulses $fr_1$, $fr_2$ and $fr_3$ are all identical in frequency but occur at different times as shown in FIG. 7.

When a VMC pulse is received by the tune down flip flop 300, the flip flop 300 goes high constituting a tune down signal to the VTO 260. Upon receipt of the second reference pulse $fr_2$, the flip flop 300 resets and goes low ending the tune-down pulse. Thus, if the VMC pulse arrives early (before $fr_2$) the timing circuit I recognizes that the VMC pulse is higher in frequency than it should be and directs the VTO 260 and in turn $fo$ to tune down to a lower frequency.

When no VMC pulse has been received by the timing circuit I when reference pulse $fr_2$ occurs, the first flip flop supplies an enable signal via conductor 312 to the second flip flop (tune up flip flop) 302 which in conjunction with reference pulse $fr_2$ causes the second flip flop 302 to go low constituting a tune up signal to VTO 260. Upon receipt of the third reference pulse $fr_3$ or the VMC pulse through summing gate 318, the second flip flop return to high and terminates its tune-up signal.

It should be noted that the reset signal functions causes rapid and repeated comparisons to be made between $fr$ and effectively $fo$ while substantial tune up or tune down signals are supplies to the VTO 260 to achieve substantial frequency lock. Once the VMC pulse falls into the window, the reseting ceases while the tuning circuit III proceeds with fine tuning to effect not only frequency lock but phase lock as well. Indeed, since a slight frequency error will initially appear as a phase error which is integrating as cycles occur, it can be seen that the phase locking effected by the tuning circuit I results in nearly perfect frequency and phase lock.

It should also be noted that in a preferred circuit, the reference frequency $fr_2$ is generated at the output of the reference window generator 276 and supplied to the reference divider 288 via conductor 322. The reference frequency $fr_2$ is therein regenerated and referenced to the input 164 to remove jitter caused by processing $fr_1$ through circuit components. As a result, the reference signal $fr_2$ is clean and quiet. In turn, the carrier $fo$ is clean and quiet because f.m. jitter is significantly reduced, vastly improving the performance of the carrier generator and the transmitter 152.

The modulator 216 used with the claimed system should be free from distortion of the input signals. The frequency range of operation should be chosen to be as wide as practical without occupying a whole octave. Any harmonics present, or generated on the lower channel carrier frequencies (e.g., 4 MHz) are thus beyond the range of any receiver in the system, the first harmonics appearing at about 8 MHz and beyond. This arrangement allows the carrier to be rather non-sinusoidal, simplifying the overall transmitter and eliminating the need for filtering. On the other hand, the audio should be relatively free from harmonics beyond 10 KHz as these will be audible in the adjacent channel. Although special filtering can be employed to prevent signals above 10 KHz from reaching such a modulator, care should be taken to ensure that the modulator does not generate harmonics of these signals, and distort the original information. Therefore, a highly linear modulator as illustrated in FIG. 8 is preferred.

Figure 8:
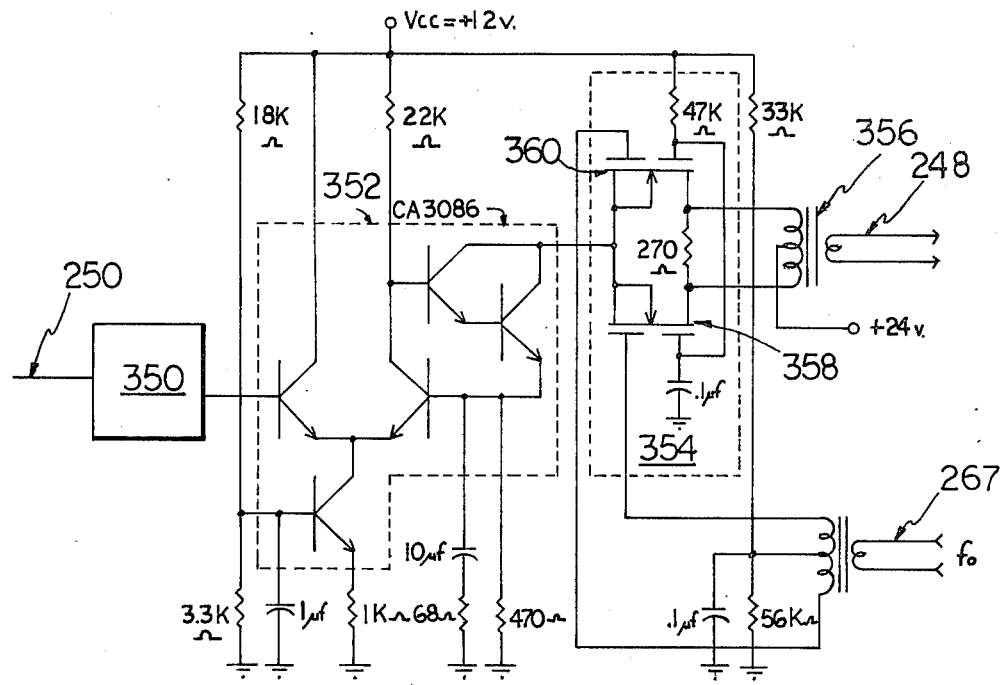
FIG. 8 is a schematic diagram of a highly linear modulator circuit useful in the practice of the invention.

Referring now to FIG. 8, a highly linear modulator circuit is depicted. The modulator circuit receives a plus 4 volt dc biased audio input via conductor 250 (FIG. 3) which is preferably filtered by filter means 350. The carrier signal $fo$ (about 1 volt peak-to-peak) is received from the VTO 260 (FIG. 4) via conductor 267. Those skilled in the art will recognize that the modulator circuit illustrated is basically a precision controlled current source 352 driving a push-pull switch 354. The switch 354 alternately changes the polarity of the controlled current across the output transformer 356 at a radio frequency (r.f.) rate to thus generate an r.f. envelope whose amplitude is precisely porportional to the magnitude of the current from the current source 352, whose output current varies in relation to the input audio. Generation of unwanted audio harmonics is prevented because of the precision of the current source and the lack of loss in the MOS field effect transistors (MOSFET) 358, 360. The r.f. envelope is impressed on the carrier at the transformer 356 and supplied to the transmit coax 248 (FIG. 3).

Figure 9:
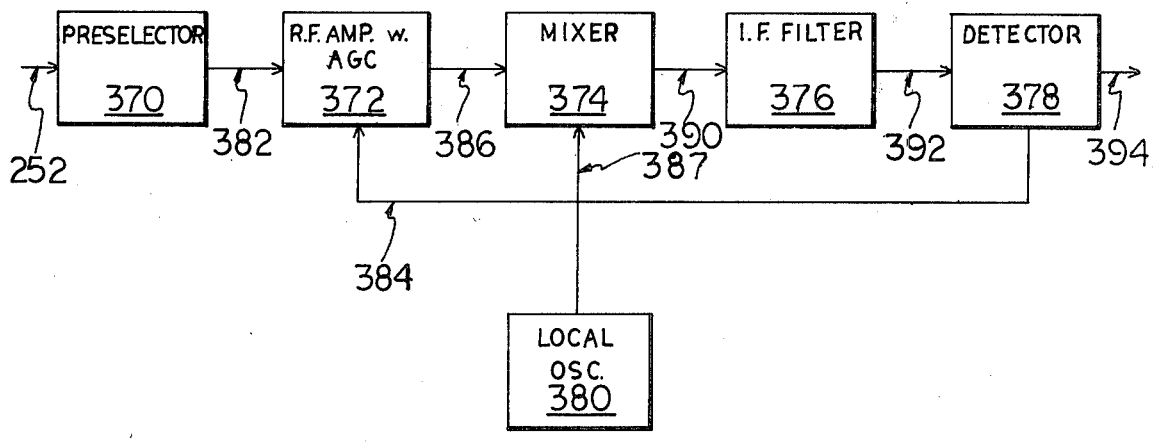
FIG. 9 illustrates a preferred receiver circuit.

The receiver 156 of FIG. 3 may be a conventional crystal receiver well-known to those skilled in the art. The presently preferred receiver 156 is illustrated in FIG. 9. As illustrated, the receiver includes a preselector 370, an R.F. Amplifier with automatic gain control 372, a mixer 374, an IF Filter a detector 378 and a local oscillator 380.

The preselector 370 receives an AM carrier on the receiver coax 252. It increases receiver image rejection and improves cross modulation preformance of the receiver. The preselector 370 supplies its output to the R.F. amplifier 372 via conductor 382. The R.F. amplifier 372 stabilizes the signal level of the AM carrier and improves noise performance. The automatic gain control section of the R.F. amplifier 372 receives the gain level of the detector 378 via conductor 384 to automatically control and stabilize the R.F. amplifier output. The R.F. amplifier 372 is preferably of the type having a dual gated MOSFET. The RF amplifier output is supplied to the mixer 374 conductor 386. The mixture 374 also receives the output of the local oscillator 380 via conductor 387. The oscillator 380 is preferably crystal controlled for stability. The mixer output is supplied to the I.F. filter 376 via conductor 390. The I.F. filter, which preferably is of the type which includes two transformers and a ceramic filter, isolates the incoming channel and removes interference from adjacent AM carriers. The I.F. filter output is supplied to the detector 378 via conductor 392. The detector 378 extracts the amplitude modulated signal (e.g., audio) and supplies it to amplifier 225 via conductor 394 (FIG. 3). The amplifier may be of the type illustrated in FIG. 16 of the parent application hereto, Ser. No. 253,264, filed May 15, 1972.

The receiver 156 hereinabove described (FIG. 8) may receive inputs from as low as −70dbm to a max of −40dbm. A max signal level of −40dbm is preferred to minimize cross talk and cross modulation. The R.F. amplifier of the MOSFET type assures an 80db down cross modulation level and is thus preferred. With a receiver noise figure of 4db using the preferred components and with a 10 KHz bandwidth thermal noise level of −134dbm, a −70dbm input signal to the receiver will appear at the detector 378 with an acceptable 60db signal to noise ratio.

Figure 10:
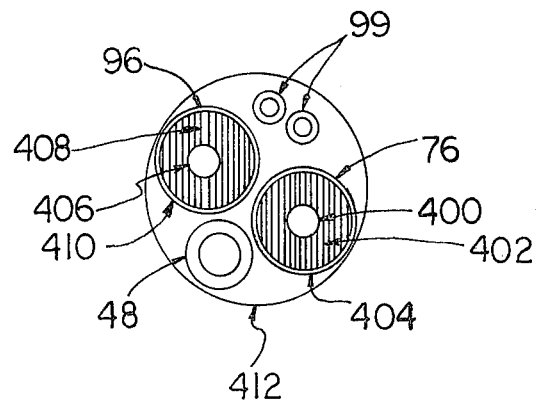
FIG. 10 is a cross sectional view of a cable preferred for interconnecting stations with common equipment.

The cable 32 (FIG. 2) interconnecting the stations 30 and common equipment unit 36 is better illustrated in FIG. 10. The cable 32 includes the data coax 76, the radio frequency coax 96, a twisted pair of conference conductors 99 and a power conductor 48. The data coax 76 has a center conductor 400 surrounded by electrical insulation 402 and an R.F. shield 404. The R.F. coax 96 similarly has a center conductor 406 surrounded by electrical insulation 408 and an R.F. shield 410. The coaxes 76 and 96 with the insulated power conductor 48 and insulated twisted pair 99 are contained in a sheathing 412 to constitute common cabling.

Figure 11:
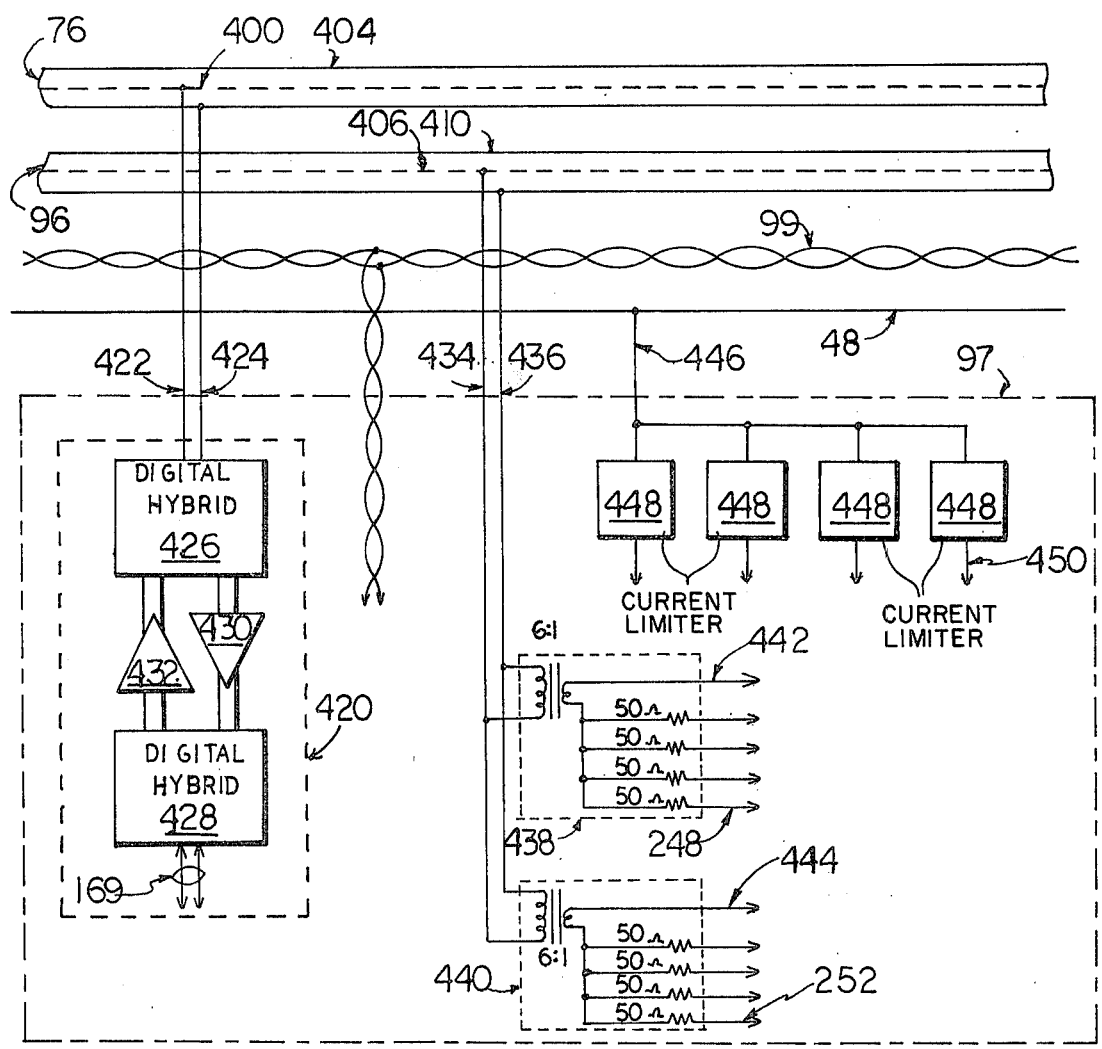
FIG. 11 is a schematic wiring diagram illustrating means to connect a station to the cabling of FIG. 10.

Connection means 97 to connect a station 30 to the cabline 32 is best illustrated in FIG. 11. As shown in FIG. 11, the data coax 76 is connected to an isolation circuit 420 by conductors 422 and 424 connected to the conductor 400 and shield 404, respectively. The isolation circuit 420 is preferred so that an electrical fault (e.g., a short) in one phone 30 will not adversely affect the data signals to all other stations 30. The circuit 420 includes a first digital hybrid 426, a second digital hybrid 428 and two line amplifiers 430 and 432. Amplifier 432 receives incoming control signals from the first hybrid 426 and supplies them to the second hybrid 428 for transmission to the station 30 on coax 169 (FIG. 3). The other amplifier 430 receives outgoing control data transmissions from the second hybrid 428 and supplies them to the data coax 71 via hybrid 426. The data may be transmitted up to ten phones for the connection means 97 illustrated.

The R.F. coax 96 is connected at its center conductor 406 and shield 419 by conductors 434 and 436, respectively. The conductors 434 and 436 are connected to two transformer/resistor networks 438, 440 which prevent any one or more phones (stations 30) from loading the R.F. coax 96 causing heavy losses and standing wave problems. The transformer 438 may have up to ten output lines 248 and a ground to shield 442. Each R.F. line 248 (FIG. 3) is provided for connection to one transmitter 152 of a station 30, the R.F. line 248 being a shielded coax (e.g., R.G. 174). The transformer 440 may have up to 10 input lines 252 and a ground to shield 444. Each R.F. line 252 is provided for connection to one receiver 156 of a station 30, the R.F. line 252 being a shielded coax (e.g., R.G. 174). Power to the separate stations 30 is obtained from the power line 48 via conductor 446 and supplied through up to ten current limiters 448 and conductors 450 to each station 30 associated with the connector means 97. Connection to the twisted pair 99 is effected by connecting a twisted pair 246 (FIG. 3) from each station as convenient.

Figure 12:
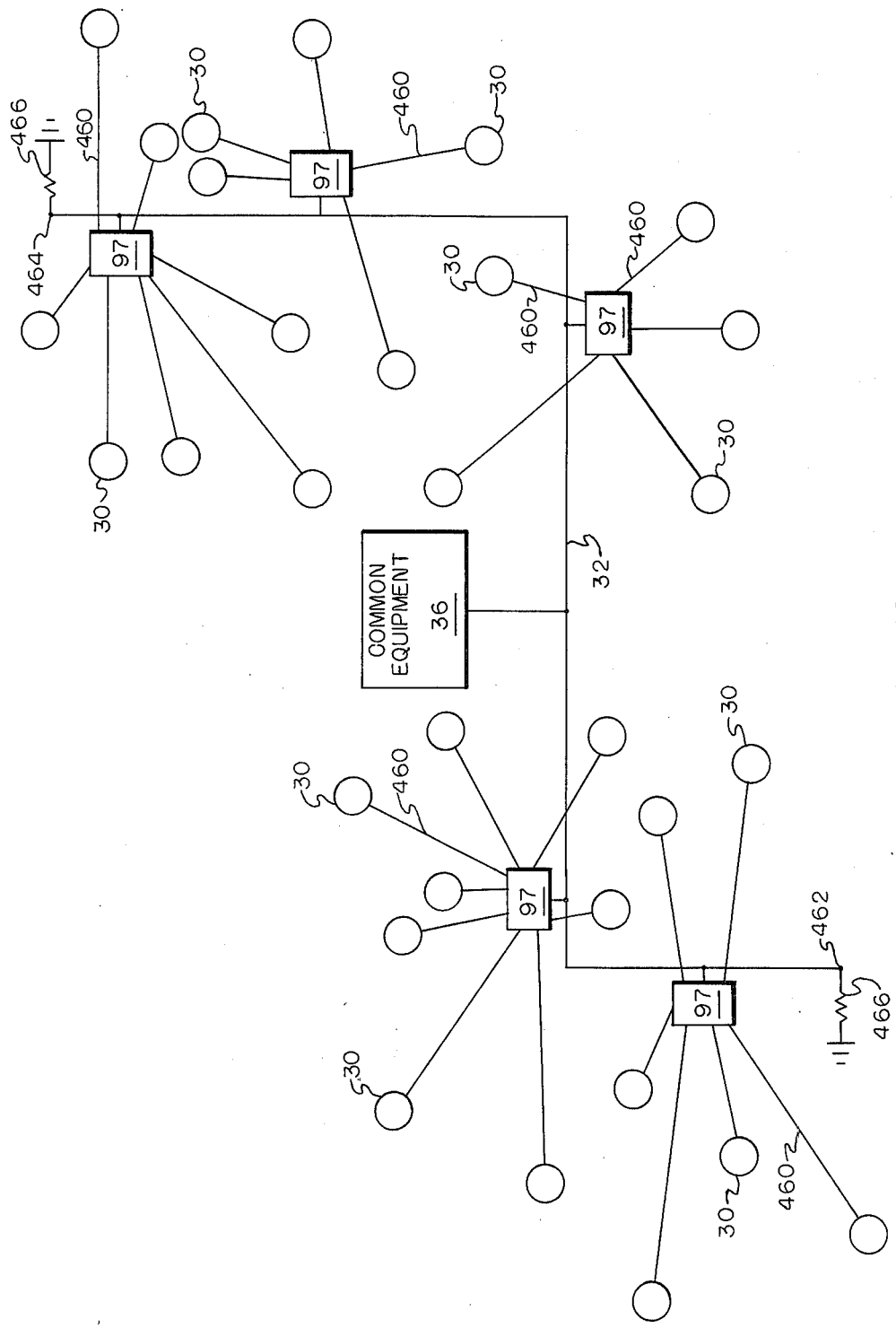
FIG. 12 illustrates a typical cable layout useful in the invention.

The system as disclosed is adaptable to any combination or permutation of cable layouts. For example, FIG. 12 illustrates one cable layout which is demonstrative of the flexibility of the system. A plurality of stations 30 are shown connected to the cable 32 and to branch cables 460. Branch cables 460 can be positioned to service office centers or whatever depending on the needs of the particular installation. Since a direct line to and from central switching is not required for every station 30, the system can by layed out without limitation. The terminal or bitter end 462, 464 may be terminated with the center conductor 406 connected to ground (shield) by a 50 ohm resistor 466.

The system as herein disclosed accommodates 255 terminals (i.e., stations 30 or trunk line cards 80). The control data conductor 76 (FIGS. 2, 3) in the cable 32 is used for two-way communication of control information between terminals 30 and the Processor I. The data conductor 76 is time shared among the terminals, the cable being used for each terminal to communicate control signals with the Processor I for about 244 microseconds. After 255 terminals have been serviced in sequence, a synchronization signal (frame) is sent down the conductor 76 to the individual station synchronization detector 167. Thereafter the 255 terminals are again serviced.

Figure 13:
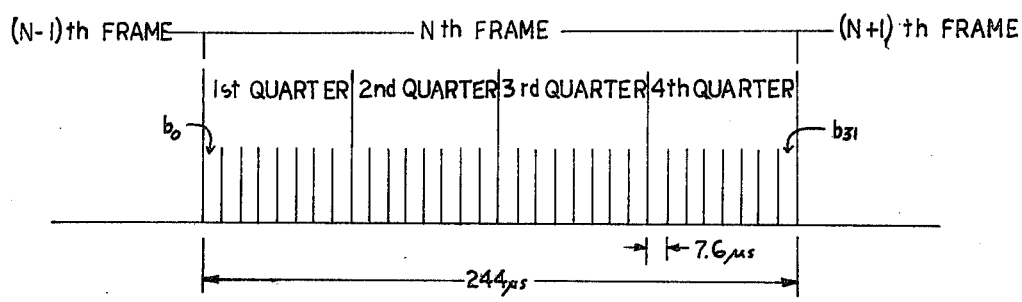
FIG. 13 illustrates data frames used for communication between the processor and terminals.

The time-sharing plan may be best understood by regarding the data communication between the Processer I and terminals in terms of data "frames" as illustrated in FIG. 13. As depicted, each frame is about 244 microseconds ($\mu$s) in time duration. The frame may be divided into four (4) quarters each of which is comprised of eight (8) bits of about 7.6 microseconds in duration.

The information transmitted in the frames is binary in nature. That is, the presence or absence of a voltage in the various bits are preselected to reflect terminal status and other real control signals. Real control signals may be regarded as signals from the dial 188, panel 194 and hook switch 190 as well as being signals, dial tones and the like.

During the first quarter of its frame the data transmitter 152 of a station 30 sends its keyboard data (dial 206 and chassis control 208) to the Processor I. In the illustrated system the keyboard digits are the numerals 1 through 9, 0 (zero), (asterisk) and # (pound sign). These are transmitted in bits $b_0$, $b_1$, $b_2$ and $b_3$ as follows:

| $b_0$ | $b_1$ | $b_2$ | $b_3$ | Keyboard |
|---|---|---|---|---|
| 1 | 0 | 0 | 0 | Digit 1 |
| 0 | 1 | 0 | 0 | Digit 2 |
| 1 | 1 | 0 | 0 | Digit 3 |
| 0 | 0 | 1 | 0 | Digit 4 |
| 1 | 0 | 1 | 0 | Digit 5 |
| 0 | 1 | 1 | 0 | Digit 6 |
| 1 | 1 | 1 | 0 | Digit 7 |
| 0 | 0 | 0 | 1 | Digit 8 |
| 1 | 0 | 0 | 1 | Digit 9 |
| 0 | 1 | 0 | 1 | Digit 0 |
| 0 | 0 | 0 | 1 | * Asterisk |
| 1 | 0 | 1 | 1 | Hold Button |
| 0 | 1 | 1 | 1 | TCD Button |
| 0 | 0 | 1 | 1 | # Pound |
| 1 | 1 | 1 | 1 | Conference Button |

The presence of a voltage or a high in bit $b_4$ shifts the meaning of the data in bits $b_0$ through $b_3$. That is, when $b_4$ is high and another code is present in $b_0$ through $b_3$, the resulting code is interpreted by the Processor I to govern special keyset and attendant console functions as hereinafter set forth.

The $b_5$ bit is the hook or cradle switch bit. When the handset 204 is removed from the station 30 chassis, the hook switch activates and the translator 160 generates a high or voltage for bit $b_5$. The $b_6$ bit is an accessory bit not presently in use. The $b_7$ bit is high or contains a voltage when the terminal is connected and powered (i.r., plugged into the system cabling).

The second quarter of bits is not used for basic terminals. It is reserved for special keyset functions.

The third quarter of bits in the frame of FIG. 13 is used to send supervisory signals to the terminal from the Processor I. The signals transmitted in these bits are as follows:

$b_{16}$ — When high it directs the illumination of a lamp 210 near the hold button.

$b_{17}$ — When high it directs the illumination of a lamp 211 near the TCD button.

$b_{18}$ — When high it directs the illumination of a lamp 212 near the CONF button.

$b_{19}$ — When high it directs activation of the ringer 232.

$b_{20}$ — When high, it directs application of power to the transmitter 152 and receiver 156 via conductor 250.

The remaining three bits of the third quarter are coded to direct action as follows:

| $b_{21}$ | $b_{22}$ | $b_{23}$ | |
|---|---|---|---|
| 0 | 0 | 0 | No action |
| 1 | 0 | 0 | Generate 128 Hz busy tone |
| 0 | 1 | 0 | Generate 256 Hz dial tone |
| 1 | 1 | 0 | Generate 1024 Hz beep tone for special features |
| 0 | 0 | 1 | Connect to conference line 1 |
| 1 | 0 | 1 | Connect to conference line 2 |
| 0 | 1 | 1 | Connect to conference line 3 |
| 1 | 1 | 1 | Connect to conference line 4 |

The fourth quarter of the frame is used to send to the transmitter 152 of a station 30 the channel number (N) of a receiver 56 to which it is to communicate. This code sets the number into the VMC 262 of a transmitter 152 and in turn sets the carrier frequency fo of the transmitted signal.

The synchronization frame is generated by the system synchronizer 70 through the interface unit 68 (FIG. 2). The signal is one in which all bits are high except the last bit $b_{31}$. The synchronization detector 167 (FIG. 3) senses this frame and sends a reset signal to the clock counters in time with the bit $b_{31}$.

Figure 14:
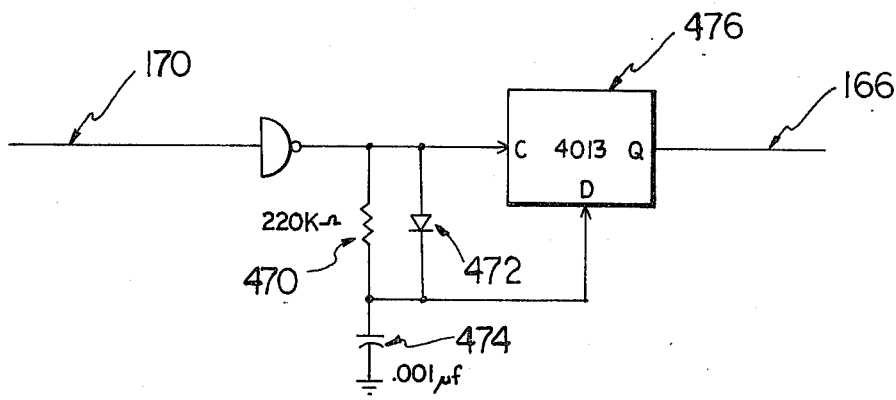
FIG. 14 is a schematic diagram of a preferred synchronization detector.

The circuit of FIG. 14 illustrates a preferred synchronization detector 167. As shown, the detector 167 receives all frames over conductor 170. The RC network comprised of resistor 470, diode 472 and capacitor 474 reads all frames. It detects the low $b_{31}$ and causes flip flop 476 to reverse sharply and reset the counters 160. No frame (FIG. 13) other than the synchronization frame can have all bits high and the last bit low. As a result, the RC network component values are selected to have a threshold voltage which can only be reached when a large number of bits are sequentially high (e.g., 25 to 30).

Referring now to the Processor I, its operation can be understood best by first understanding the nature of the information stored in its memory 62. The memory 62 stores information pertinent to the status of each terminal in the system. The information stored is sent and received in the frames. The memory control 64 acts as an input-output device for the memory 62. The program panel 60 imposes fixed parameters on system operation; and the decision logic 66 operates on the information in memory 62 within the fixed parameters by making logic decisions. In particular the information stored in the memory 62 is as follows:

a. Frame Condition Storage

A 16 bit digital word for each terminal which represents the condition of the terminal. This condition is updated as the phone is acted upon. That is, when the handset 192 is on its hook (hook switch 190 closed), and not in use the storage or memory frame condition would be a condition termed "awaiting incoming call." If the handset 192 is lifted the Processor I detects the hook switch bit in the data frame and changes the condition to "local dial." The present system design incorporates 16 basic frame conditions with many variations to each condition bringing the total number of combinations to well over 200.

b. Dial Number Storage

The dialed number is received from the dialing station 30 in its data frame. This number is then sent out to the dialing terminal over the data cable 76 from the Processor I to cause its transmitter 152 to lock onto the channel corresponding to that dial number. Whatever digital code is stored in this portion of the memory 62 will tune the transmitter 152 in the terminal associated with that digital word to the frequency associated with it. The dial number is an eight bit digital word. Of course, the Processor I also advises the calling terminal of the status of the called terminal by causing a ringing signal or busy signal to be generated.

c. Auxilliary Number Storage

This 8 bit storage location is used to store dial numbers which may be needed in the future. For example, assume that terminal A and terminal B are in conversation with each other and that terminal A wishes to hold terminal B and consult with a third party (terminal C). To do so terminal A presses his hold button. This places terminal B in an "on hold" condition and places terminal A in "local dial" condition. Terminal A may now dial terminal C with the result that terminals A and C are in conversation with terminal A holding terminal B. The dial number portion of the memory 62 for terminal A now holds terminal C's dial number. The auxilliary portion of terminal A's memory is now used to hold terminal B's dial number. If A should choose to release hold on B then the information in the auxilliary number storage is retrieved and placed in the dial number location. If A should choose to transfer B to C by pressing the transfer button then A's auxilliary number storage contents are written into C's dial number storage location and A's dial number storage contents are written into B's dial number storage location. Now B and C are in conversation, each having the others dial number in their dial number storage location in the memory 62.

d. Keyset Information

Eight bits of storage are allotted to describe whether or not a terminal in question is associated with a keyphone system, and if so to which system and what portion of that system. Keysets in the disclosed System are programmed from the program panel 60 in the Processor I. The panel 60 sets up the codes in this portion of the memory 62 and causes those terminals so designated to operate in conjunction with each other as keysets.

e. Class of Service

Sixteen bits of memory frame storage are used to allow or disallow the terminal associated with the storage frame to use specific system features. These sixteen bits are listed below along with what they control. All 16 bits are programmed from the program panel 60.
1. Dial Out. A "1" programmed for this location allows the terminal to make local outside calls. A "O" restricts the phone to inside calls only.
2. Dail L.D A "1" here allows long distance calls to be made. A "O" restricts the phone to local or inside calls only.
3. Outside Call. Allows terminal to receive outside calls.
4. Inside Call. Allows terminal to receive inside calls.
5. Page. Allows the terminal to access to the paging system 42.
6. Abb. Dial. Allows terminal to use abbreviated dial features.
7. Trunk Queing. Allows terminal to be placed on list to use special trunk.
8. Trunk Queing Priority. Allows terminal to place himself at top of list for any given call back time. That is, a station user may reserve a conference line or a trunk line for a specific time. This is accomplished by adapting a synchronizer 70 output as a digital time clock and allowing the real time reference to be transmitted and compared in the memory 62.

(These special trunk groups may be Watts lines, Tie lines, Foreign exchange lines, normal combination trunk, etc.)

f. Outside Dial Storage

As numbers are dialed on a given terminal they must be stored until used by the Processor I or by the trunk line unit II. For example, in making an inside call to extension 134, the digits 1, 3 and 4 are stored as they are dialed. After the last digit (4) has been dialed, the completed number 134 is passed through a number compiler to produce the dial number code corresponding to 134. When an outside call is made, the numbers dialed from the terminal are stored as they are dialed in this outside dial storage. They are then sent out one at a time through the trunk line unit II to the central office in the form of dial pulses. The memory 62 is required as a buffer to allow the inside user to dial as fast as he wishes while allowing the dial pulses to go out at a prescribed rate. Forty-four bits of storage are used in this section, enough for 11 digits of outside dialing.

g. Frame Index

Twelve bits of storage are used for counting and indexing purposes. The indexing signals tell the Processor I in which number slot a newly arriving number is to be stored or where the trunk line unit II is to retrieve the next number to dial out. This indexing function is performed in portions of these 12 bits of storage. Various timing signals are also generated here. For example, when a terminal is ringing it rings for 2 seconds and then rests for 4 seconds. This interruption is generated as follows:

At the first instant (or frame) in which the terminal starts ringing, the frame index is set to all zeros. The next frame around, 1/16 second later, this zero index is augmented by one, and then is successively augmented by one at each frame cycle. When the count reaches 32 (2 second later) the ringer is turned off and the indexing starts over again at all zeros. Again the count is augmented to 64 (4 seconds) and then the ringer is turned on again. This is repeated until the terminal is answered or the caller hangs up. With 12 bits of storage, intervals of up to 256 seconds can be timed. Longer intervals are used in various operator recall features.

h. Time Compare Storage

Certain available, but optional, features of the system, such as hotel wake up service and timed special trunk queing require signals to be generated for the Processor I on behalf of a given terminal at a specific preprogrammed time of day. Sixteen bits of storage are thus reserved by storing time of day bits which can be dialed by a terminal. These bits are compared with the system digital clock each cycle time. When a comparison occurs a signal is given to the Processor I such that it can execute whatever feature was originally programmed with the time.

i. Abbreviated Dial

The last portion of storage is the abbreviated dial memory. This section is not a part of the memory 62 allotted to each terminal but is a separate memory which is loaded from the programming panel 60. Its contents are available to any terminal whose class of service allows the use of the abbreviated dial feature. This memory is used to store frequently dialed numbers (e.g., up to 80 of them) such that they can be accessed and automatically dialed with a fast simple three digit code.

The Processor I is a flexible unit. By loading the programming panel 60, modifying the memory 62 and decision logic 66, virtually any auxiliary phone feature desired can be provided. Those skilled in the art will recognize that various processors can be adapted for use herein. For example, an INTEL 8080 Microprocessor may be used by setting it for about 64,000 bits or random access memory and about 32,000 bits of program storage.

To better understand the operation of this system a simple example of events and operations relating to system use if helpful. Assume phone No. 201 wishes to call phone No. 202. The following describes the sequence of events:

1. The initial condition of both phones is assumed to be on the hook (awaiting an incoming call).
2. Phone No. 201 goes off the hook. During the time frame associated with No. 201, the hook switch bit ($b_5$) is sent to the Processor I. The Processor I routinely receives the information from the phone and presents that along with the phone's present condition to its decision making logic 66. The decision making logic 66 sees a hook switch bit ($b_5$) along with an awaiting incoming call condition. It logically concludes that the phone was picked up and instructs the terminal interface 68 to send a dial tone code back to No. 201. It also instructs the memory control 64 to write a new condition for phone No. 201. The new condition is local dial. All this occurs during the time "frame" associated with No. 201.
3. Phone No. 201 dials the first digit "2". The Processor I receives the digit "2" and sends it to its decision making logic 66 along with the condition local dial. The decision making logic 66 recognizes that the first digit of an internal phone has been dialed. It causes the digit "2" to be stored in memory 62 and causes the local digit condition in memory to be modified to "local dial with 1 digit dialed." It also causes the dial tone code being sent to phone No. 201 to stop.
4. Phone No. 201 dials the second digit "0." The Processor I again stores the "0" in memory 62 and modifies the condition to "local dial with 2 digits dialed."
5. Phone No. 201 dials the third digit "2." The decision making logic 66 now is presented with the condition "local dial with 2 digits dialed" and the third digit "2." It then retrieves the 2 and 0 from memory 62 and combines them with the newly arrived last digit 2. This number (202) is passed through a read only circuit (part of the decision making logic 66) and is converted to a code representing the time frame and transmitter tuning code for phone No. 202. This code is an eight bit word which is then stored in memory 62 in dial number storage of phone No. 201. The dial number is the logic or digital address code for the phone to which a given phone seeks to be or is in conversation. This dial number is also given to the memory control circuit 64 and is used to go into the memory 62 and retrieve the condition of phone No. 202. This condition is brought back into the decision making logic 66. The decision making logic 66 then sees that No. 202 is in condition "awaiting incoming call." (If any other condition were there, the Processor I would send a busy tone code to No. 201.)

The decision making logic 66 then causes many things to happen. First, the condition of No. 201 is updated in memory 62 to "conversation." Also data is sent back to No. 201 which turns on its transmitter and receiver and tunes the transmitter (via the dial number) to the channel of No. 202. The memory control 64 then goes to the memory location of No. 202 and changes its condition to "ring" and writes the dial number associated with No. 201 in No. 202's dial number memory location. Later when the Processor I is operating in No. 202's time frame, it sees the ring condition and causes a ring code to be sent to No. 202. It also causes the dial number stored in No. 202's memory to be sent to No. 202 along with a code to turn on No. 202's transmitter and receiver and tune the transmitter to the frequency of No. 201's receiver. When No. 202 rings, the ring signal is internally applied to the transmitter of No. 202's circuitry and will be heard by No. 201.

6. No. 202 goes off hook to answer the ring. The Processor I when in 202's frame, receives a hook switch bit and sends it to the decision making logic 66 along with the condition "ringing." The decision making logic updates the condition to "conversation" and terminates the "ringing" code. Now the parties can communicate as desired.
7. Assume No. 202 hangs up first. The decision logic 66 sees the conversation condition with no hook switch bit 65. It concludes that No. 202 has hung up and changes its memory condition to "awaiting incoming call." It then changes the condition of No. 201 to be rewritten as "local dial" thus, No. 201 gets a dial tone and knows that No. 202 has hung up.

As a further example, assume No, 201 is talking to No. 202 and that No. 202 wishes to transfer No. 201 to 203. The sequence is as follows:

1. The initial condition of No. 201 and No. 202 is that they are in conversation. No. 203 is "awaiting an incoming call" condition.
2. No. 202 presses the hold button on his phone chassis. This sends a code to the Processor I, which when combined with the condition of No. 201 and No. 202, causes No. 202 to receive a dial tone and No. 201 is placed in the "on hold" condition. The decision logic 66 causes the memory control to read the information in No. 202's dial number storage and recover it in the auxiliary number storage. The hold lamps on both phones are also illuminated.
3. No. 202 now dials No. 203 as described above. No. 203 answers as previously described.
4. When No. 203 answers No. 202 is in a condition called "conversation with hold." No. 201 is "on hold." No. 203 is in simple conversation. Now No. 202 presses the transfer (TCD) button. This code along with the conditions of the three phones is processed to cause No. 202 to receive dial tone again (he is completely out of the conversation). No. 201 receives No. 203's dial number and vice versa. No. 201 and No. 203 are placed in simple conversation with each other.

From the above, it can be seen that almost any feature is possible as a result of programming the decision making logic 66 to operate on the given input code and initial conditions stored in memory 62 in the manner desired. Essentially, the Processor I is a small computer with a stored program which can be altered and updated or customized without having to add or substract components.

From the above, it can also be seen that the capabilities and features of the system herein disclosed permit unlimited access to all subscribers. That is, each subscriber has access to the system without limitations as occur in systems where the communications are based on availability of circuits on a time-sharing basis. The system is also entirely automatic. Manual attendant console (52, FIG. 2) functions are not necessary or required. Operation of equipment (other than dialing and selections of functions like "hold") is entirely automatic. Audio characteristics are very good because of the wide band widths and the transmitters' (e.g., 152 of FIG. 3) low noise characteristics. The system disclosed has a virtually unlimited capacity for auxiliary use features in view of the Processor I device disclosed. Further, the system does not use extensive or expensive wiring and cables as compared to other RF type systems. Finally, the centralized equipment is significantly minimized. That is, voice communications from a calling telephone do not pass through a centralized switching or processing device to a called telephone. The equipment common to the system (e.g., FIG. 2) can be located anywhere desired, is relatively inexpensive due to its simple electronic structure and is relatively small in dimension.

Further, the system herein disclosed allows telephones having numbers identified with an office or person to be readily transported or moved by simply unplugging it at its connector means 97 and replugging it in at another connector means 97. A savings in technician costs for relocating phones upon movement or relocating of offices and people may be realized.

The additional features available in the disclosed system and adaptable to other systems of the type disclosed at the option of the user are various. To best understand these optional features, the following is an operational description of features in the disclosed system.

1. Transfer, Busy, Call Diversion and Dial Intercept

A button labeled TCD accomplishes the following:
Transfer

When the user is in conversation with another party and wishes to transfer that party to another phone, he places the first party on hold, dials the number of the phone to which the transfer is to be made, and after conversation is established, presses the TCD button. The transfer is accomplished and his line is cleared.
Busy If a user's telephone is not is use and he doesn't wish to be disturbed he may press the TCD button and his telephone is then "busied-out." That is, all calls coming to his extension receive a busy signal. A small flashing light on the phone indicates the telephone is in this state.
Call Diversion If after pressing the TCD button as above to busy-out a telephone, the user dials any internal extension number, all calls originally intended for his phone are automatically diverted to the dialed extension.
Dial Intercept Any extension may answer any other ringing extension by dialing the ringing extension's number and then pressing the TCD button. The call then is transferred from the ringing phone to the user's phone.

2. Conference

A conference line may be secured by pressing the conference button any time the handset 192 of a station 30 is lifted, including when conversation in in progress between two stations 30. If a busy signal results when the conference button is pushed, then it indicates that all conference lines are in use. The busy signal lasts only two seconds however, such that any conversation in process may continue. Once a conference line has been seized, it may be automatically placed on hold by pressing the hold button. A light at both hold and conference buttons indicates a conference-on-hold condition. Any inside or outside party may now be dialed. Should they not answer or be busy, the receiver hook switch may be operated. The result is a dial tone without the loss of the seized conference line. When the dialed party does answer, the conference button may be pressed which connects the dialed party to the conference line and places the initiator (dialing party) back on the conference line. Pressing the hold button by any of the on-conference parties allows that party to call an additional party and add them to the group. Note: The total number of people on conference is limited only to the total capacity of the system. No loss in audio occurs as stations are added to, or taken off, conference.

3. Cancel, Reset, Hang Up

The telephone unit disclosed does not utilize a mechanical switch that comes in contact with the handset 204. Magnets placed internally on both sides of the handset 192 operate a magnetic reed switch 190 inside the chassis. When the handset 192 is in hand, the reed switch (cradle or hook switch) 190 may be operated as if the handset 192 is "hung-up" by pressing the reset button. This allows the user to correct a mistake in dialing, to hang-up and dial another party, etc. without actually replacing the handset 192 in its chassis cradle.

4. Ringer Volume Control

A volume control thumbwheel is mounted on the bottom of the phone case which controls the volume of the ring tone.

5. Abbreviated Dialing

This feature permits the user to dial frequently-called outside numbers by merely pressing the "6" button and a two digit number corresponding to a particular number placed in the abbreviated dialing matrix located in the Processor I. The capacity can be a maximum of 80 at the users option.

6. Paging Access

Access to a paging public address system is accomplished by pressing the "5" button and talking into handset 240.

7. Trunk Selection and Control

The attendant console 52 has a panel or matrix of illuminatable push buttons 143 for each trunk as well as a dial keyboard 142 and push button panel 141 similar to that of a station 30. On incoming calls the button 310 flashes brightly and remains flashing until intercepted by the operator. The operator presses the button to intercept the call. When the trunk line card is in conversation with the internal station 30, the button remains dimmly lit. After interception, the operator can extend the call merely by dialing the number of the station 30 to which the call is directed. Upon dialing the last digit, the call is automatically extended. If the operator wishes to announce a call before the extension she presses an internal announce button on the panel 141 before dialing the 3 digits. If she afterwards presses an external announce button on the panel 141, she is reconnected to the incoming call. She may toggle between the two parties by alternately pressing internal and external announce. By releasing either the internal or external announce buttons rather than toggling between them, a 3-way conversation is established. The operator may leave the announce condition in one of three ways: (1) The operator may exit by going to another trunk or pressing an exit key on the panel 141 which results in an external-internal connection; (2) The operator may clear the internal connection by pressing the reset button on the panel 141 which gives a dial tone and allows extension to another inside party; (3) Or the operator may terminate, which disconnects the outside party. In moving to another trunk button, the former trunk is automatically placed on park. The operator may re-enter a trunk at any time by pressing an appropriate trunk button on the matrix 143. In doing so, the inside extension to whom that trunk was in conversation remains connected and a 3-way conversation is established. Indication of this break-in may be given by a 4 second tick tack tone.

8. Attendant Camp-On

Camp-On can be initiated either by pressing a Camp-On button on the panel 141 and then extending the call or by trying to extend and receiving a busy indication and then pressing Camp-On. A momentary tone is transmitted to the inside party and music or a tick tack tone is placed on the incoming trunk.

9. Attendant Priority/Call Splitting.

The operator may break into any trunk line as mentioned earlier. The operator may also break into an internal extension and speak to that extension only, in which case the trunk or extension connected to the interrupted extension is placed on hold. Trunks (trunk line cards 80) on hold receive background music, whereas internal extensions on hold receive a momentary tone. If the called extension is on a conference call, the operator will only be in conversation with the one interrupted party. The other members of the conference will not be interrupted nor will they have an indication of a party having been removed. Call splitting to an extension is achieved by dialing that extension and pressing a split button on the panel 141. When the split key is released, the original conversation is restored.

10. Serial Call

Before extending an incoming call, the attendant may press a Serial Call (SC) button on the panel 141. The call is then extended in the normal manner by dialing the three-digit number. When the inside extension hangs up the lamp on the trunk button will be of matrix 143 dimly flash indicating that the external trunk has not been disconnected when the internal extension hung up. The attendant may then intercept the trunk and extend it to another line.

11. Music On Hold

Music may be played on all trunk lines when on Camp-On or on Hold. Line 101 (FIG. 2) is provided in the common equipment cabinet 36 for this purpose.

12. Attendant Conference

The attendant may arrange conference connections for trunk or phone 30 parties. This is done in the same manner as on phone 30 with this feature.

13. Attendant Transfer (TCD)

The attendant may transfer any line to any other line in the same manner as an extension with this feature.

14. Paging Access

The attendant has access to paging by dialing 5. The attendant may also directly access page and override any other paging parties by using a special direct page key on the console. Outputs from this extension card are provided for connection to the PA system.

15. Night Service

Night service can be defined as flexible night service with individual trunk programming and a universal mode. When the attendant is absent, all trunks 80 may be programmed for the individual trunk programmed night service mode. The trunks are programmed by accessing the trunk, pressing a night service program key on the panel 141 and dialing the number internal extension. The trunk remains programmed to that number until a new number is loaded or it is cleared. The programmed number can be checked by accessing the trunk and pressing a destination request key on the panel 141 and the night service program key. The destination phone number is then displayed on a digital type read out unit on the operator's console 52. When the system is in the individual night service mode, all incoming calls are passed uninterrupted to the internal extension programmed.

If no number is programmed or if the internal party is busy the trunk assumes a universal mode. Any extension can answer this mode by dialing 8 to accept the incoming call.

In the universal mode, the incoming call is detected by the Processor I which causes the page/public address system 42 to issue a gong sound. Thus, any one on the premises will be advised of the call and may proceed to the nearest station to accept it. Interception is made by dialing the digit 4.

16. Power Failure Transfer

As an option, a battery pack can be provided with the trunk card cabinet which would power a 100-extension system for 3 to 4 hours during power failures. A special inverter from this pack powers the interface equipment.

17. Tone On Priority

Priority interruptions may be directed solely to the dialed-extension to be interrupted; with the other party placed on hold rather than create a three-way eavesdropping situation. A tone may be transmitted to the other party on interruption of the conversation.

18. Destination Request

The operator is able to determine the identity internal and external (trunk) connections by pushing the DR button on the panel 141 and dialing the station concerned. The station number or trunk number connected to the dialed extension will appear in the digital readout on the console 52.

19. Digital Clock

The console digital readout functions as a digital clock when not otherwise in use.

It is to be understood that the embodiment herein disclosed is illustrative of the principles of the inventions. Reference herein to details of the illustrated embodiment is not intended to limit the scope of the claims which themselves recite those features regarded as essential to the inventions.

I claim:

1. A random access communication system for a plurality of telephone sets comprising:

a data processor;

common cabling for communicating frequency multiplexed amplitude modulated signals between said telephone sets and control signals between said telephone sets and said data processor;

means for coupling said processor and said sets to said cabling;

a plurality of said telephone sets, each of said telephone sets comprising:

a transmitter for transmitting a carrier signal over said cabling to other telephone sets, each said transmitter comprising an adjustable source of said carrier signals to transmit selected carrier signals and means to amplitude modulate the carrier signal transmitted by said transmitter, a receiver for receiving a carrier signal over said cabling from other telephone sets, each said receiver being pre-tuned to receive only one carrier signal which differs for each telephone set and is dedicated thereto and means to amplitude demodulate the carrier signal received by said receiver, and means for initiating a call to a called telephone set comprising means responsive to pulse code groups which are included in said control signals for digitally adjusting the frequency of the carrier signal of the transmitter associated with a calling telephone set to the dedicated carrier signal associated with the receiver of the called telephone set and adjusting the frequency of the carrier signal of the transmitter associated with the called set to the dedicated carrier signal associated with the receiver of the calling set; and wherein said data processor responds to said means for initiating a call by transmitting pulse code groups which are included in said control signals indentifying the called and calling telephone sets to said calling and called sets respectively, and wherein said control signals are transmitted in time division multiplex format.

2. A random access communication system for a plurality of telephone sets comprising:

a data processor;

common cabling for communicating signals and frequency multiplexed amplitude modulated signals between said telephone sets and control signals between said telephone sets and said data processor and said telephone sets;

means for coupling said processor and said sets to said cabling;

a plurality of said telephone sets, each of said telephone sets comprising:

a transmitter for transmitting a carrier signal over said cabling to other telephone sets, each said transmitter comprising an adjustable source of said carrier signals to transmit selected carrier signals and means to amplitude modulate said selected carrier signal, a receiver for receiving an amplitude modulated carrier signal over said cabling from other telephone sets, each said receiver being pretuned to receive only one said amplitude modulated carrier signal which differs for each telephone set and is dedicated thereto, said receiver having means to demodulate the received amplitude modulated carrier signal, and means for transmitting over and receiving from said cabling control signals for executing feature oriented functions at called and calling telephone sets, said control signals comprising a recurrent pulse stream divided into time frames wherein each frame is dedicated to a respective set, said processor being responsive to control signals received from any set during its time frame for providing reply signals to said any set during its dedicated time frame and for providing control signals to at least one other telephone set during its respective dedicated time frame, said control and reply signals comprising pulse code groups representative of the functions associated with said control or reply signals; and wherein said processor includes means responsive to a first control signal transmitted over said cabling from a calling telephone set representing the address of a called telephone set which transmits a first reply signal over said cabling to said calling set, said calling set comprising means responsive to said first reply signal to digitally adjust the carrier frequency of its transmitter to the dedicated carrier of the receiver of said called set, said means being further responsive to said first control signal by generating, providing and transmitting a second reply signal over said cabling during the dedicated time frame of said called set, said called set comprising means responsive to said second reply signal to digitally adjust the carrier frequency of its transmitter to the dedicated carrier of the receiver of said calling station.

3. An arrangement according to claim 2 wherein said processor comprises a memory and means responsive to the control signals transmitted over said cabling for examining the operating conditions of each set and storing pulse code groups representative of the updated conditions in said memory.

4. An arrangement according to claim 3 wherein each calling set includes a source of a normally-disabled local busy tone, said processor being responsive to a control signal received from a calling set representing the address of a called set to examine the operating conditions of said called set stored in memory and generate and transmit a reply control signal to said calling set representative of a busy condition, said calling set including means responsive to said last named reply signal to enable said source which provides said local busy tone.

5. An arrangement according to claim 3 wherein said cabling includes conference conductor means at at least one calling telephone set for initiating a conference call to include a second called set in a communication with a first called set which includes means for generating and transmitting over said common cabling a control signal representative of a hold condition, and further, control signals representative of the address of the second called set, said processor being responsive to the hold control signal and second set address control signal to store in memory the hold condition of the first called set and to establish audio communication between said calling set and said second called set over said common cabling, means at said calling set to provide and transmit a conference signal over said common cabling, said processor responsive to said transmitted conference signal for providing and transmitting a conference switching signal over said common cabling to said calling set and said first and second called sets during their respective dedicated time frames, said calling set and said first and second called sets being responsive to said transmitted conference switching signal for providing and transmitting audio signals associated with said calling and first and second called sets as audio signals over said conference conductor.

6. An arrangement for establishing further conference calls as provided in claim 5 comprising means for time division multiplexing said different conference calls on said conference conductor.

7. A random access multiple station telephone system comprising:
a plurality of stations interconnected by conductors having:
transmitter means to transmit across a broad radio frequency spectrum in selected frequency bands over said conductors,
receiver means to receive transmissions from other stations only in one preassigned frequency band identified with said receiver and dedicated thereto and different from the pre-assigned frequency bands of all other receivers,
signaling means to signal operator input signals, and
logic and audio control means to receive the operator input signals and cause the generation of system control signals reflective of said operator input, to cause system control signals to be impressed and extracted from a data frame, and to cause the generation of internal station operating signals reflective of incoming control signals extracted from said data frame;
system control means having:
means to generate and transmit a intervaled data frame for each station of said plurality of stations over said conductors,
means to impress on and extract from said data frame outgoing and incoming system control signals respectively,
means to process said system control signals in accordance with a preselected program,
memory means with input-output means to receive and store selected system control signals, and
interfacing and logic means to receive said incoming system control signals and to generate said outgoing system control signals, said processing means operating in accordance with a preselected program to selectively store system control signals and to selectively generate system control signals to control said system and each station thereof.

8. The system of claim 7 wherein said system control means includes a system synchronizer to transmit synchronizing signals to each of said stations and each said station control means includes a station synchronizer to receive said synchronizing signals and to synchronize said logic and audio control means with said system synchronizer.

9. The system of claim 8 wherein each said transmitter means includes a carrier generator circuit conductively connected to a modulator circuit to supply an amplitude modulated carrier signal, said carrier generator circuit being comprised of:
a voltage tuned oscillator (VTO) having a tuning input and an output;
a variable modulus counter (VMC) having a first input connected to receive the output of said VTO, a second input connected to receive an integer from said interfacing and logic means reflective of the desired carrier to be transmitted by said transmitter, and an output;
a frequency and phase locking tuning circuit having a first input to receive a reference frequency from an external source, a second input connected to receive said VMC output and an output connected to said VTO tuning input; and wherein
said VMC output is the quotient of said VTO output divided by said integer which is compared with and locked in frequency and phase with said reference frequency by sending tuning signals to said VTO to tune said VTO output as necessary to effect said frequency and phase lock.

10. The system of claim 8 including a common equipment unit which includes said system control means, public address means and a trunk line unit having a plurality of trunk line cards and corresponding plurality of interface circuits connected to an external telephone system.

11. The system of claim 10 including an operator's console having means to intercept and extend calls incoming from said external telephone system.

12. The system of claim 11 wherein said operator's console has night service switching means activating said system control means to selectively divert incoming calls to a selected station and to hold said incoming call while announcing its existence by said public address means.

13. The system of claim 12 wherein said stations in cooperation with said system control means have means to hold incoming calls, transfer calls, divert calls, busy out the station and dial intercept calls incoming to another station.

14. The system of claim 13 wherein said operator's console has means in cooperation with said system control means to camp incoming calls on an internal station that is busy and means to extend one incoming call serially.

15. The system of claim 14 wherein said operator's console has digital number display means to display the identifying phone number of a first station in communication with a second station and the identity of stations to which incoming calls are to be diverted when in night service.

16. The system of claim 15 wherein said conductors are comprised of a control data coaxial cable, a R.F. coaxial cable and a power conductor.

17. The system of claim 16 wherein said cable includes conference conductors, and said stations include means to connect to said conference to effect conference calls.

18. The system of claim 17 wherein said stations include means to conduct a plurality of said conference calls over said conference conductors in accordance with a time division multiplex scheme.

* * * * *

UNITED STATES PATENT AND TRADEMARK OFFICE
CERTIFICATE OF CORRECTION

PATENT NO. : 4,013,840
DATED : March 22, 1977
INVENTOR(S) : Scott K. Anderson

It is certified that error appears in the above-identified patent and that said Letters Patent are hereby corrected as shown below:

Column 3, line 66, change "turning" to ---tuning---;

Column 6, line 55, insert after "dial signals" ---into dial signals---;

Column 12, line 63, insert after "Filter" ---376---;

Column 13, line 49, change "cabline" to ---cabling---;

Column 14, line 66, insert after (zero), ---*---;

Column 18, line 66, change "or" to ---of---;

Column 19, line 29, change "digit" to ---dial---.

Signed and Sealed this thirtieth Day of August 1977

[SEAL]

Attest:

RUTH C. MASON
*Attesting Officer*

C. MARSHALL DANN
*Commissioner of Patents and Trademarks*